(12) United States Patent
Yada et al.

(10) Patent No.: US 8,206,888 B2
(45) Date of Patent: Jun. 26, 2012

(54) RADIATION-SENSITIVE RESIN COMPOSITION

(75) Inventors: Yuuji Yada, Tokyo (JP); Tomoki Nagai, Tokyo (JP)

(73) Assignee: JSR Corporation, Tokyo (JP)

( * ) Notice: Subject to any disclaimer, the term of this patent is extended or adjusted under 35 U.S.C. 154(b) by 655 days.

(21) Appl. No.: 12/094,820

(22) PCT Filed: Nov. 21, 2006

(86) PCT No.: PCT/JP2006/323141
§ 371 (c)(1),
(2), (4) Date: May 22, 2009

(87) PCT Pub. No.: WO2007/060919
PCT Pub. Date: May 31, 2007

(65) Prior Publication Data
US 2010/0028800 A1    Feb. 4, 2010

(30) Foreign Application Priority Data

Nov. 25, 2005    (JP) .................................. 2005-339751

(51) Int. Cl.
*G03F 7/004* (2006.01)
(52) U.S. Cl. ..................... 430/270.1; 430/905; 430/921; 430/922
(58) Field of Classification Search ............... 430/270.1, 430/905, 921, 922
See application file for complete search history.

(56) References Cited

U.S. PATENT DOCUMENTS

| | | | |
|---|---|---|---|
| 5,981,140 A | 11/1999 | Sato et al. | |
| 6,120,972 A | 9/2000 | Iwanaga et al. | |
| 6,136,500 A * | 10/2000 | Kobayashi et al. | 430/270.1 |
| 2002/0090569 A1 | 7/2002 | Suzuki et al. | |
| 2004/0018445 A1 | 1/2004 | Akita et al. | |
| 2004/0170918 A1 | 9/2004 | Maesawa et al. | |
| 2005/0053861 A1 | 3/2005 | Yoneda et al. | |
| 2005/0158657 A1 | 7/2005 | Suzuki et al. | |

FOREIGN PATENT DOCUMENTS

| | | |
|---|---|---|
| EP | 1113005 | 7/2001 |
| EP | 1238972 | 9/2002 |
| EP | 1406123 | 4/2004 |
| EP | 1640804 | 3/2006 |
| EP | 1686424 | 8/2006 |
| JP | 59-45439 | 3/1984 |
| JP | 60-52845 | 3/1985 |
| JP | 2-25850 | 1/1990 |
| JP | 05-255240 | 10/1993 |
| JP | 10-97060 | 4/1998 |
| JP | 11-143079 | 5/1999 |
| JP | 11-352677 | 12/1999 |
| JP | 2002-049155 | 2/2002 |
| JP | 2002-156759 | 5/2002 |
| JP | 2003-43679 | 2/2003 |
| JP | 2004-109959 | 4/2004 |
| JP | 2004-219963 | 8/2004 |
| JP | 2004-250427 | 9/2004 |
| JP | 2005-29548 | 2/2005 |
| JP | 2005-314572 | 11/2005 |
| JP | 2006-63155 | 3/2006 |
| WO | WO 03/007079 | 1/2003 |

OTHER PUBLICATIONS

Nakamura et al., "Resist Surface Roughness Calculated using Theoretical Percolation Model", Journal of Photopolymer Science and Technology, 1998, pp. 16-22, Vo. 11, No. 4.

Shiobara et al., "Resist Edge Roughness with Reducing Pattern Size", SPIE, pp. 313-323, vol. 3333.

Palmateer et al., "Line Edge Roughness in sub-0.18-um Resist Patterns", SPIE, pp. 634-642, vol. 3333.

Namatsu et al., "Three-dimensional siloxane resist for the formation of nanopatterns with minimum linewidth fluctuations", J. Vac. Sci. Technol., pp. 69-76, B16(1), Jan./Feb. 1998, American Vacuum Society.

* cited by examiner

*Primary Examiner* — John Chu
(74) *Attorney, Agent, or Firm* — Ditthavong, Mori & Steiner, P.C.

(57) ABSTRACT

It is intended to provide a radiation-sensitive resin composition, which comprises a radiation-sensitive acid generator excellent in resolution performance, heat stability, and storage stability, suppresses fluctuations in line width and deterioration in pattern profile attributed to standing waves, and produces a resist pattern improved in nano edge roughness and LEF. The radiation-sensitive resin composition is characterized by (A) a radiation-sensitive acid generator comprising: a sulfonium salt compound typified by 2,4,6-trimethylphenyldiphenylsulfonium 2,4-difluorobenzenesulfonate, 2,4,6-trimethylphenyldiphenylsulfonium 4-trifluoromethylbenzenesulfonate, or the like; and a sulfonimide compound. It is preferred that the composition should further comprise (B) a resin typified by a 4-hydroxystyrene/4-t-butoxystyrene copolymer, a 4-hydroxystyrene/t-butyl (meth)acrylate, or the like.

5 Claims, 4 Drawing Sheets

RADIATION-SENSITIVE RESIN COMPOSITION

FIELD OF THE INVENTION

The present invention relates to a radiation-sensitive resin composition which is suitable as a resist useful for micromachining using various types of radiations, for example, far ultraviolet rays such as KrF, ArF, or $F_2$ excimer lasers, X-rays such as synchrotron radiations, and charged particle beams such as electron beams.

BACKGROUND OF THE INVENTION

In the field of micromachining typified by the production of integrated circuit devices, design rules for finer pattern lithography have rapidly made progress to achieve highly integrated circuits and cost reduction. Along with this progress, the development of a lithography process that stably performs finer processing has been pursued strongly.

In response to such movement, a variety of chemically amplified resists comprising a radiation-sensitive acid generator that generates an acid upon exposure to radiation have been proposed, which are improved in sensitivity as resists by the catalysis of the acid. For example, Patent Document 1 discloses a combination of a resin having a t-butyl or t-butoxycarbonyl protecting group with a radiation-sensitive acid generator. Patent Document 2 discloses a combination of a resin having a silyl protecting group with a radiation-sensitive acid generator. In addition, many reports on chemically amplified resists have been made, such as a resist comprising: a resin having an acetal or ketal protecting group; and a radiation-sensitive acid generator (see e.g., Patent Document 3).

Patent Document 1: Japanese Laid-Open Patent Publication No. 59-45439
Patent Document 2: Japanese Laid-Open Patent Publication No. 60-52845
Patent Document 3: Japanese Laid-Open Patent Publication No. 2-25850

However, along with progress in design rules for a finer pattern lithography process, problems have been coming to the surface in terms of fluctuations in line width attributed to standing waves, deterioration in pattern profile attributed to standing waves, nano edge roughness or LEF (line end foreshortening; a phenomenon in which the film thickness of a pattern of lines gets thinner toward the edge of the pattern), and so on. Specifically, when a pattern having such problems is transferred to a substrate by treatment such as etching, the line width precision of the pattern may be reduced, leading to significant reduction in the electrical characteristics or the like of an integrated circuit device (see e.g., Non-Patent Documents 1, 2, 3, and 4). Therefore, the above-described performances, in addition to resolution performance required for conventional chemically amplified resists, are very important for responding to finer integrated circuit devices.

Non-Patent Document 1: J. Photopolym. Sci. Tech. (1998) p 571
Non-Patent Document 2: Proc. SPIE Vol. 3333, p 313
Non-Patent Document 3: Proc. SPIE Vol. 3333, p 634
Non-Patent Document 4: J. Vac. Sci. Technol. B16 (1), (1998) p 69

SUMMARY OF THE INVENTION

The present invention has been accomplished in consideration of such an actual situation. Thus, an objective of the present invention is to provide a radiation-sensitive resin composition, which comprises a radiation-sensitive acid generator having excellent resolution performance in response to active radiations, for example, various types of radiations, for example, extreme or far ultraviolet rays typified by KrF, ArF, or $F_2$ excimer lasers or EUV, X-rays such as synchrotron radiations, and charged particle beams such as electron beams, and being excellent in heat stability and storage stability, sufficiently suppresses fluctuations in line width and deterioration in pattern profile attributed to standing waves, and produces a resist pattern improved in nano edge roughness and LEF.

Other objectives and advantages of the present invention will be obvious from descriptions below.

The present invention provides a radiation-sensitive resin composition characterized by comprising (A) a radiation-sensitive acid generator comprising: a compound having a structure represented by the following formula (1-a) and a structure represented by the following formula (1-b); and a sulfonimide compound,

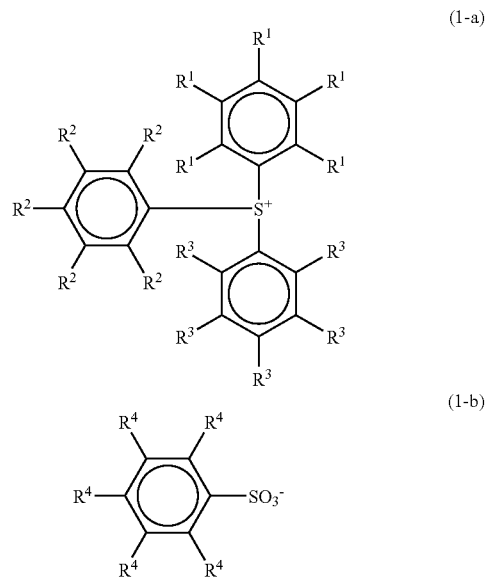

wherein, in the formula (1-a), each $R^1$, each $R^2$, and each $R^3$ independently represent a hydrogen atom, a hydroxyl group, a linear, branched, or cyclic alkyl group having 1 to 10 carbon atoms, a linear, branched, or cyclic alkoxyl group having 1 to 10 carbon atoms, or a t-butoxycarbonylmethoxy group, and satisfy at least one of a condition under which two or more of the $R^1$ moieties are respectively a group other than a hydrogen atom, a condition under which two or more of the $R^2$ moieties are respectively a group other than a hydrogen atom, and a condition under which two or more of the $R^3$ moieties are respectively a group other than a hydrogen atom, and wherein, in the formula (1-b), each $R^4$ independently represents a hydrogen atom, a fluorine atom, or a trifluoromethyl group, and one or more of the $R^4$ moieties are respectively a fluorine atom or a trifluoromethyl group.

Hereinafter, the present invention will be described in detail.

Acid Generator (A)

The radiation-sensitive resin composition of the present invention is characterized by comprising a radiation-sensitive acid generator (hereinafter, referred to as an "acid generator (A)") comprising: a compound (hereinafter, referred to as an "acid generator (1)") having a structure represented by the formula (1-a) and a structure represented by the formula (1-b); and a sulfonimide compound.

In the formula (1-a), examples of the linear, branched, or cyclic alkyl group having 1 to 10 carbon atoms, which is represented by $R^1$, $R^2$, and $R^3$ include methyl, ethyl, n-propyl, i-propyl, n-butyl, i-butyl, sec-butyl, t-butyl, n-pentyl, neopentyl, 2-methyl-1-butyl, 2-methyl-2-butyl, n-hexyl, n-heptyl, n-octyl, 2-ethylhexyl, n-nonyl, n-decyl, cyclopentyl, and cyclohexyl groups.

Alternatively, examples of the linear, branched, or cyclic alkoxyl group having 1 to 10 carbon atoms, which is represented by $R^1$, $R^2$, and $R^3$ include methoxy, ethoxy, n-propoxy, i-propoxy, n-butoxy, i-butoxy, sec-butoxy, t-butoxy, n-pentyloxy, neopentyloxy, 2-methyl-1-butoxy, 2-methyl-2-butoxy, n-hexyloxy, n-heptyloxy, n-octyloxy, 2-ethylhexyloxy, n-nonyloxy, n-decyloxy, cyclopentyloxy, and cyclohexyloxy groups.

In the formula (1-a), the $R^1$ to $R^3$ moieties must satisfy at least one of a condition under which two or more of the $R^1$ moieties are respectively a group other than a hydrogen atom, a condition under which two or more of the $R^2$ moieties are respectively a group other than a hydrogen atom, and a condition under which two or more of the $R^3$ moieties are respectively a group other than a hydrogen atom.

When two or more of the $R^1$, $R^2$, or $R^3$ moieties are respectively a group other than a hydrogen atom, such a group other than a hydrogen atom is preferably a hydroxyl, methyl, ethyl, n-propyl, i-propyl, n-butyl, i-butyl, sec-butyl, t-butyl, methoxy, t-butoxy, or t-butoxycarbonylmethoxy group, or the like, particularly preferably a methyl, ethyl, i-propyl, t-butoxy, or t-butoxycarbonylmethoxy group, or the like.

Hereinafter, the structure represented by the formula (1-a) and the structure represented by the formula (1-b) are referred to as a "sulfonium cation (a)" and a "sulfonate anion (b)", respectively.

Specific examples of the sulfonium cation (a) include 2,3-dihydroxyphenyldiphenylsulfonium cation, 2,4-dihydroxyphenyldiphenylsulfonium cation, 2,5-dihydroxyphenyldiphenylsulfonium cation, 2,6-dihydroxyphenyldiphenylsulfonium cation, 3,4-dihydroxyphenyldiphenylsulfonium cation, 3,5-dihydroxyphenyldiphenylsulfonium cation, 2,4,6-trihydroxyphenyldiphenylsulfonium cation, 2-hydroxy-3-methylphenyldiphenylsulfonium cation, 2-hydroxy-4-methylphenyldiphenylsulfonium cation, 2-hydroxy-5-methylphenyldiphenylsulfonium cation, 2-hydroxy-6-methylphenyldiphenylsulfonium cation, 3-hydroxy-4-methylphenyldiphenylsulfonium cation, 3-hydroxy-5-methylphenyldiphenylsulfonium cation, 2-methyl-3-hydroxyphenyldiphenylsulfonium cation, 2-methyl-4-hydroxyphenyldiphenylsulfonium cation, 2-methyl-5-hydroxyphenyldiphenylsulfonium cation, 3-methyl-4-hydroxyphenyldiphenylsulfonium cation, 2-hydroxy-3-methoxyphenyldiphenylsulfonium cation, 2-hydroxy-4-methoxyphenyldiphenylsulfonium cation, 2-hydroxy-5-methoxyphenyldiphenylsulfonium cation, 2-hydroxy-6-methoxyphenyldiphenylsulfonium cation, 3-hydroxy-4-methoxyphenyldiphenylsulfonium cation, 3-hydroxy-5-methoxyphenyldiphenylsulfonium cation, 2-methoxy-3-hydroxyphenyldiphenylsulfonium cation, 2-methoxy-4-hydroxyphenyldiphenylsulfonium cation, 2-methoxy-5-hydroxyphenyldiphenylsulfonium cation, 3-methoxy-4-hydroxyphenyldiphenylsulfonium cation, 2-hydroxy-3-t-butoxyphenyldiphenylsulfonium cation, 2-hydroxy-4-t-butoxyphenyldiphenylsulfonium cation, 2-hydroxy-5-t-butoxyphenyldiphenylsulfonium cation, 2-hydroxy-6-t-butoxyphenyldiphenylsulfonium cation, 3-hydroxy-4-t-butoxyphenyldiphenylsulfonium cation, 3-hydroxy-5-t-butoxyphenyldiphenylsulfonium cation, 2-t-butoxy-3-hydroxyphenyldiphenylsulfonium cation, 2-t-butoxy-4-hydroxyphenyldiphenylsulfonium cation, 2-t-butoxy-5-hydroxyphenyldiphenylsulfonium cation, 3-t-butoxy-4-hydroxyphenyldiphenylsulfonium cation, 2-hydroxy-3-t-butoxycarbonylmethoxyphenyldiphenylsulfonium cation, 2-hydroxy-4-t-butoxycarbonylmethoxyphenyldiphenylsulfonium cation, 2-hydroxy-5-t-butoxycarbonylmethoxyphenyldiphenylsulfonium cation, 2-hydroxy-6-t-butoxycarbonylmethoxyphenyldiphenylsulfonium cation, 3-hydroxy-4-t-butoxycarbonylmethoxyphenyldiphenylsulfonium cation, 3-hydroxy-5-t-butoxycarbonylmethoxyphenyldiphenylsulfonium cation, 2-t-butoxycarbonylmethoxy-3-hydroxyphenyldiphenylsulfonium cation, 2-t-butoxycarbonylmethoxy-4-hydroxyphenyldiphenylsulfonium cation, 2-t-butoxycarbonylmethoxy-5-hydroxyphenyldiphenylsulfonium cation, 3-t-butoxycarbonylmethoxy-4-hydroxyphenyldiphenylsulfonium cation, 2,3-dimethylphenyldiphenylsulfonium cation, 2,4-dimethylphenyldiphenylsulfonium cation, 2,5-dimethylphenyldiphenylsulfonium cation, 2,6-dimethylphenyldiphenylsulfonium cation, 3,4-dimethylphenyldiphenylsulfonium cation, 3,5-dimethylphenyldiphenylsulfonium cation, 2,4,6-trimethylphenyldiphenylsulfonium cation, 2,3-diethylphenyldiphenylsulfonium cation, 2,4-diethylphenyldiphenylsulfonium cation, 2,5-diethylphenyldiphenylsulfonium cation, 2,6-diethylphenyldiphenylsulfonium cation, 3,4-diethylphenyldiphenylsulfonium cation, 3,5-diethylphenyldiphenylsulfonium cation, 2,4,6-triethylphenyldiphenylsulfonium cation, 2,4-di-n-propylphenyldiphenylsulfonium cation, 2,4,6-tri-n-propylphenyldiphenylsulfonium cation, 2,4-di-i-propylphenyldiphenylsulfonium cation, 2,4,6-tri-i-propylphenyldiphenylsulfonium cation, 2,4-di-n-butylphenyldiphenylsulfonium cation, 2,4,6-tri-n-butylphenyldiphenylsulfonium cation, 2,4-di-i-butylphenyldiphenylsulfonium cation, 2,4,6-tri-i-butylphenyldiphenylsulfonium cation, 2,4-di-sec-butylphenyldiphenylsulfonium cation, 2,4,6-tri-sec-butylphenyldiphenylsulfonium cation, 2,4-di-t-butylphenyldiphenylsulfonium cation, 2,4,6-tri-t-butylphenyldiphenylsulfonium cation, 2-methyl-4-n-propylphenyldiphenylsulfonium cation, 2-methyl-4-i-propylphenyldiphenylsulfonium cation, 2-methyl-4-n-butylphenyldiphenylsulfonium cation, 2-methyl-4-t-butylphenyldiphenylsulfonium cation, 2-methyl-4-n-hexylphenyldiphenylsulfonium cation, 2-methyl-4-n-octylphenyldiphenylsulfonium cation, 2-methyl-4-n-decylphenyldiphenylsulfonium cation, 2-methyl-4-n-cyclohexylphenyldiphenylsulfonium cation, 2-methyl-3-methoxyphenyldiphenylsulfonium cation, 2-methyl-4-methoxyphenyldiphenylsulfonium cation, 2-methyl-5-methoxyphenyldiphenylsulfonium cation, 2-methyl-6-methoxyphenyldiphenylsulfonium cation, 3-methyl-4-methoxyphenyldiphenylsulfonium cation, 3-methyl-5-methoxyphenyldiphenylsulfonium cation, 2-methoxy-3-methylphenyldiphenylsulfonium cation, 2-methoxy-4-methylphenyldiphenylsulfonium cation, 2-methoxy-5-methylphenyldiphenylsulfonium cation, 3-methoxy-4- methylphenyldiphenylsulfonium cation, 2-methyl-4-n-propoxyphenyldiphenylsulfonium cation, 2-methyl-4-i-propoxyphenyldiphenylsulfonium cation, 2-methyl-4-n-butoxyphenyldiphenylsulfonium cation, 2-methyl-4-n-hexyloxyphenyldiphenylsulfonium cation, 2-methyl-4-n-octyloxyphenyldiphenylsulfonium cation, 2-methyl-4-n-decyloxyphenyldiphenylsulfonium cation, 2-methyl-4-cyclohexyloxyphenyldiphenylsulfonium cation, 2-methyl-3-t-butoxyphenyldiphenylsulfonium cation, 2-methyl-4-t-butoxyphenyldiphenylsulfonium cation, 2-methyl-5-t-butoxyphenyldiphenylsulfonium cation, 2-methyl-6-t-butoxyphenyldiphenylsulfonium cation, 3-methyl-4-t-butoxyphenyldiphenylsulfonium cation, 3-methyl-5-t-butoxyphenyldiphenylsulfonium cation, 2-t-butoxy-3-methylphenyldiphenylsulfonium cation, 2-t-butoxy-4-methylphenyldiphenylsulfonium cation, 2-t-butoxy-5-methylphenyldiphenylsulfonium cation, 3-t-butoxy-4-methylphenyldiphenylsulfonium cation, 4-t-butoxy-2,6-dimethylphenyldiphenylsulfonium cation, 2-methyl-3-t-butoxycarbonylmethoxyphenyldiphenylsulfonium cation, 2-methyl-4-t-butoxycarbonylmethoxyphenyl-diphenylsulfonium cation, 2-methyl-5-t-butoxycarbonyl-methoxyphenyldiphenylsulfonium cation, 2-methyl-6-t-butoxycarbonylmethoxyphenyldiphenylsulfonium cation, 3-methyl-4-t-butoxycarbonylmethoxyphenyl-diphenylsulfonium cation, 3-methyl-5-t-butoxycarbonyl-methoxyphenyldiphenylsulfonium cation, 2-t-butoxycarbonylmethoxy-3-methylphenyldiphenylsulfonium cation, 2-t-butoxycarbonylmethoxy-4-methylphenyldiphenylsulfonium cation, 2-t-butoxycarbonylmethoxy-5-methylphenyldiphenylsulfonium cation, 3-t-butoxycarbonylmethoxy-4-methylphenyldiphenylsulfonium cation, 4-t-butoxycarbonyl-methoxy-2,6-dimethylphenyldiphenylsulfonium cation, 2,3-dimethoxyphenyldiphenylsulfonium cation, 2,4-dimethoxyphenyldiphenylsulfonium cation, 2,5-dimethoxyphenyldiphenylsulfonium cation, 2,6-dimethoxyphenyldiphenylsulfonium cation, 3,4-dimethoxyphenyldiphenylsulfonium cation, 3,5-dimethoxyphenyldiphenylsulfonium cation, 2,4,6-trimethoxyphenyldiphenylsulfonium cation, 2-methoxy-3-t-butoxyphenyldiphenylsulfonium cation, 2-methoxy-4-t-butoxyphenyldiphenylsulfonium cation, 2-methoxy-5-t-butoxyphenyldiphenylsulfonium cation, 2-methoxy-6-t-butoxyphenyldiphenylsulfonium cation, 3-methoxy-4-t-butoxyphenyldiphenylsulfonium cation, 3-methoxy-5-t-butoxyphenyldiphenylsulfonium cation, 2-t-butoxy-3-methoxyphenyldiphenylsulfonium cation, 2-t-butoxy-4-methoxyphenyldiphenylsulfonium cation, 2-t-butoxy-5-methoxyphenyldiphenylsulfonium cation, 3-t-butoxy-4-methoxyphenyldiphenylsulfonium cation, 2,3-di-t-butoxyphenyldiphenylsulfonium cation, 2,4-di-t-butoxyphenyldiphenylsulfonium cation, 2,5-di-t-butoxyphenyldiphenylsulfonium cation, 2,6-di-t-butoxyphenyldiphenylsulfonium cation, 3,4-di-t-butoxyphenyldiphenylsulfonium cation, 3,5-di-t-butoxyphenyldiphenylsulfonium cation, 2,4,6-tri-t-butoxyphenyldiphenylsulfonium cation, 2-methoxy-3-t-butoxycarbonylmethoxyphenyldiphenylsulfonium cation, 2-methoxy-4-t-butoxycarbonylmethoxyphenyl-diphenylsulfonium cation, 2-methoxy-5-t-butoxycarbonyl-methoxyphenyldiphenylsulfonium cation, 2-methoxy-6-t-butoxycarbonylmethoxyphenyldiphenylsulfonium cation, 3-methoxy-4-t-butoxycarbonylmethoxyphenyl-diphenylsulfonium cation, 3-methoxy-5-t-butoxycarbonyl-methoxyphenyldiphenylsulfonium cation, 2-t-butoxycarbon-ylmethoxy-3-methoxyphenyldiphenylsulfonium cation, 2-t-butoxycarbonylmethoxy-4-methoxyphenyldiphenylsulfonium cation, 2-t-butoxycarbonylmethoxy-5-methoxyphenyldiphenylsulfonium cation, 3-t-butoxycarbonylmethoxy-4-methoxyphenyldiphenylsulfonium cation, 2-t-butoxy-3-t-butoxycarbonylmethoxyphenyldiphenylsulfonium cation, 2-t-butoxy-4-t-butoxycarbonylmethoxyphenyl-diphenylsulfonium cation, 2-t-butoxy-5-t-butoxycarbonyl-methoxyphenyldiphenylsulfonium cation, 2-t-butoxy-6-t-butoxycarbonylmethoxyphenyldiphenylsulfonium cation, 3-t-butoxy-4-t-butoxycarbonylmethoxyphenyl-diphenylsulfonium cation, 3-t-butoxy-5-t-butoxycarbonyl-methoxyphenyldiphenylsulfonium cation, 2-t-butoxycarbon-ylmethoxy-3-t-butoxyphenyldiphenylsulfonium cation, 2-t-butoxycarbonylmethoxy-4-t-butoxyphenyldiphenylsulfonium cation, 2-t-butoxycarbonylmethoxy-5-t-butoxyphenyldiphenylsulfonium cation, 3-t-butoxycarbonylmethoxy-4-t-butoxyphenyldiphenylsulfonium cation, 2,3-di-t-butoxycarbonylmethoxyphenyldiphenylsulfonium cation, 2,4-di-t-butoxycarbonylmethoxyphenyldiphenylsulfonium cation, 2,5-di-t-butoxycarbonylmethoxyphenyl-diphenylsulfonium cation, 2,6-di-t-butoxycarbonylmethox-yphenyldiphenylsulfonium cation, 3,4-di-t-butoxycarbonyl-methoxyphenyldiphenylsulfonium cation, 3,5-di-t-butoxycarbonylmethoxyphenyldiphenylsulfonium cation, 2,4,6-tri-t-butoxycarbonylmethoxyphenyl-diphenylsulfonium cation, phenylbis(2,3-dimethylphenyl)sulfonium cation, phenylbis(2,4-dimethylphenyl)sulfonium cation, phenylbis(2,5-dimethylphenyl)sulfonium cation, phenylbis(2,6-dimethylphenyl)sulfonium cation, phenylbis(3,4-dimethylphenyl)sulfonium cation, phenylbis(3,5-dimethylphenyl)sulfonium cation, phenylbis(2,4,6-trimethylphenyl)sulfonium cation, tris(2,3-dimethylphenyl)sulfonium cation, tris(2,4-dimethylphenyl)sulfonium cation, tris(2,5-dimethylphenyl)sulfonium cation, tris(2,6-dimethylphenyl)sulfonium cation, tris(3,4-dimethylphenyl)sulfonium cation, tris(3,5-dimethylphenyl)sulfonium cation, and tris(2,4,6-trimethylphenyl)sulfonium cation.

Of these sulfonium cations (a), 2,4-dihydroxyphenyl-diphenylsulfonium cation, 2,4-dimethylphenyldiphenylsulfonium cation, 2,6-dimethylphenyldiphenylsulfonium cation, 2,4,6-trimethylphenyldiphenylsulfonium cation, 2,4,6-triethylphenyldiphenylsulfonium cation, 2,4,6-tri-i-propylphenyldiphenylsulfonium cation, 2,4-di-t-butoxyphenyldiphenylsulfonium cation, 2,4-di-t-butoxycarbonylmethoxyphenyldiphenylsulfonium cation, 4-t-butoxy-2,6-dimethylphenyldiphenylsulfonium cation, 4-t-butoxycarbonylmethoxy-2,6-dimethylphenyldiphenyl-sulfonium cation, or the like is preferable.

Next, in the formula (1-b), both a fluorine atom and a trifluoromethyl group are preferable as a group represented by $R^4$.

Specific examples of the sulfonate anion (b) include 2-fluorobenzenesulfonate anion, 3-fluorobenzenesulfonate anion, 4-fluorobenzenesulfonate anion, 2,3-difluorobenzenesulfonate anion, 2,4-difluorobenzenesulfonate anion, 2,5-difluorobenzenesulfonate anion, 2,6-difluorobenzenesulfonate anion, 3,4-difluorobenzenesulfonate anion, 3,5-difluorobenzenesulfonate anion, 2,4,6-trifluorobenzenesulfonate anion, 2,3,5,6-tetrafluorobenzenesulfonate anion, 2,3,4,5,6-pentafluorobenzenesulfonate anion, 2-fluoro-3-trifluoromethyl-benzenesulfonate anion, 2-fluoro-4-trifluoromethylbenzenesulfonate anion, 2-fluoro-5-trifluoromethylbenzenesulfonate anion, 2-fluoro-6-trifluoromethylbenzenesulfonate anion, 3-fluoro-4-trifluoromethylbenzenesulfonate anion, 3-fluoro- 5-trifluoromethylbenzenesulfonate anion, 2-trifluoromethyl-3-fluorobenzenesulfonate anion, 2-trifluoromethyl-4-fluorobenzenesulfonate anion, 2-trifluoromethyl-5-fluorobenzenesulfonate anion, 3-trifluoromethyl-4-fluorobenzenesulfonate anion, 2-trifluoromethylbenzenesulfonate anion, 3-trifluoromethylbenzenesulfonate anion, 4-trifluoromethylbenzenesulfonate anion, 2,3-bis(trifluoromethyl)benzenesulfonate anion, 2,4-bis(trifluoromethyl)benzenesulfonate anion, 2,5-bis(trifluoromethyl)benzenesulfonate anion, 2,6-bis(trifluoromethyl)benzenesulfonate anion, 3,4-bis(trifluoromethyl)benzenesulfonate anion, 3,5-bis(trifluoromethyl)benzenesulfonate anion, 2,4,6-tris(trifluoromethyl)benzenesulfonate anion, 2,3,5,6-tetrakis(trifluoromethyl)benzenesulfonate anion, and 2,3,4,5,6-pentakis(trifluoromethyl)benzenesulfonate anion.

Of these sulfonate anions (b), 4-fluorobenzenesulfonate anion, 2,4-difluorobenzenesulfonate anion, 2,6-difluorobenzenesulfonate anion, 2,3,4,5,6-pentafluorobenzenesulfonate anion, 4-trifluoromethylbenzenesulfonate anion, 2,4-bis(trifluoromethyl)benzenesulfonate anion, 2,4,6-tris(trifluoromethyl)benzenesulfonate anion, 2,3,4,5,6-pentakis(trifluoromethyl)benzenesulfonate anion, or the like is preferable.

Specific examples of the acid generator (1) preferably used in the present invention include 2,4-dihydroxyphenyldiphenylsulfonium 4-fluorobenzenesulfonate, 2,4-dihydroxyphenyldiphenylsulfonium 2,4-difluorobenzenesulfonate, 2,4-dihydroxyphenyldiphenylsulfonium 2,6-difluorobenzenesulfonate, 2,4-dihydroxyphenyldiphenylsulfonium 2,3,4,5,6-pentafluorobenzenesulfonate, 2,4-dihydroxyphenyldiphenylsulfonium 4-trifluoromethylbenzenesulfonate, 2,4-dihydroxyphenyldiphenylsulfonium 2,4-bis(trifluoromethyl)benzenesulfonate, 2,4-dihydroxyphenyldiphenylsulfonium 2,4,6-tris(trifluoromethyl)benzenesulfonate, 2,4-dihydroxyphenyldiphenylsulfonium 2,3,4,5,6-pentakis(trifluoromethyl)benzenesulfonate, 2,4-dimethylphenyldiphenylsulfonium 4-fluorobenzenesulfonate, 2,4-dimethylphenyldiphenylsulfonium 2,4-difluorobenzenesulfonate, 2,4-dimethylphenyldiphenylsulfonium 2,6-difluorobenzenesulfonate, 2,4-dimethylphenyldiphenylsulfonium 2,3,4,5,6-pentafluorobenzenesulfonate, 2,4-dimethylphenyldiphenylsulfonium 4-trifluoromethylbenzenesulfonate, 2,4-dimethylphenyldiphenylsulfonium 2,4-bis(trifluoromethyl)benzenesulfonate, 2,4-dimethylphenyldiphenylsulfonium 2,4,6-tris(trifluoromethyl)benzenesulfonate, 2,4-dimethylphenyldiphenylsulfonium 2,3,4,5,6-pentakis(trifluoromethyl)benzenesulfonate, 2,6-dimethylphenyldiphenylsulfonium 4-fluorobenzenesulfonate, 2,6-dimethylphenyldiphenylsulfonium 2,4-difluorobenzenesulfonate, 2,6-dimethylphenyldiphenylsulfonium 2,6-difluorobenzenesulfonate, 2,6-dimethylphenyldiphenylsulfonium 2,3,4,5,6-pentafluorobenzenesulfonate, 2,6-dimethylphenyldiphenylsulfonium 4-trifluoromethylbenzenesulfonate, 2,6-dimethylphenyldiphenylsulfonium 2,4-bis(trifluoromethyl)benzenesulfonate, 2,6-dimethylphenyldiphenylsulfonium 2,4,6-tris(trifluoromethyl)benzenesulfonate, 2,6-dimethylphenyldiphenylsulfonium 2,3,4,5,6-pentakis(trifluoromethyl)benzenesulfonate, 3,5-dimethylphenyldiphenylsulfonium 4-fluorobenzenesulfonate, 3,5-dimethylphenyldiphenylsulfonium 2,4-difluorobenzenesulfonate, 3,5-dimethylphenyldiphenylsulfonium 2,6-difluorobenzenesulfonate, 3,5-dimethylphenyldiphenylsulfonium 2,3,4,5,6-pentafluorobenzenesulfonate, 3,5-dimethylphenyldiphenylsulfonium 4-trifluoromethylbenzenesulfonate, 3,5-dimethylphenyldiphenylsulfonium 2,4-bis(trifluoromethyl)benzenesulfonate, 3,5-dimethylphenyldiphenylsulfonium 2,4,6-tris(trifluoromethyl)benzenesulfonate, 3,5-dimethylphenyldiphenylsulfonium 2,3,4,5,6-pentakis(trifluoromethyl)benzenesulfonate, 2,4,6-trimethylphenyldiphenylsulfonium 4-fluorobenzenesulfonate, 2,4,6-trimethylphenyldiphenylsulfonium 2,4-difluorobenzenesulfonate, 2,4,6-trimethylphenyldiphenylsulfonium 2,6-difluorobenzenesulfonate, 2,4,6-trimethylphenyldiphenylsulfonium 2,3,4,5,6-pentafluorobenzenesulfonate, 2,4,6-trimethylphenyldiphenylsulfonium 4-trifluoromethylbenzenesulfonate, 2,4,6-trimethylphenyldiphenylsulfonium 2,4-bis(trifluoromethyl)benzenesulfonate, 2,4,6-trimethylphenyldiphenylsulfonium 2,4,6-tris(trifluoromethyl)benzenesulfonate, 2,4,6-trimethylphenyldiphenylsulfonium 2,3,4,5,6-pentakis(trifluoromethyl)benzenesulfonate, 2,4,6-triethylphenyldiphenylsulfonium 4-fluorobenzenesulfonate, 2,4,6-triethylphenyldiphenylsulfonium 2,4-difluorobenzenesulfonate, 2,4,6-triethylphenyldiphenylsulfonium 2,6-difluorobenzenesulfonate, 2,4,6-triethylphenyldiphenylsulfonium 2,3,4,5,6-pentafluorobenzenesulfonate, 2,4,6-triethylphenyldiphenylsulfonium 4-trifluoromethylbenzenesulfonate, 2,4,6-triethylphenyldiphenylsulfonium 2,4-bis(trifluoromethyl)benzenesulfonate, 2,4,6-triethylphenyldiphenylsulfonium 2,4,6-tris(trifluoromethyl)benzenesulfonate, 2,4,6-triethylphenyldiphenylsulfonium 2,3,4,5,6-pentakis(trifluoromethyl)benzenesulfonate, 2,4,6-tri-i-propylphenyldiphenylsulfonium 4-fluorobenzenesulfonate, 2,4,6-tri-i-propylphenyldiphenylsulfonium 2,4-difluorobenzenesulfonate, 2,4,6-tri-i-propylphenyldiphenylsulfonium 2,6-difluorobenzenesulfonate, 2,4,6-tri-i-propylphenyldiphenylsulfonium 2,3,4,5,6-pentafluorobenzenesulfonate, 2,4,6-tri-i-propylphenyldiphenylsulfonium 4-trifluoromethylbenzenesulfonate, 2,4,6-tri-i-propylphenyldiphenylsulfonium 2,4-bis(trifluoromethyl)benzenesulfonate, 2,4,6-tri-i-propylphenyldiphenylsulfonium 2,4,6-tris(trifluoromethyl)benzenesulfonate, 2,4,6-tri-i-propylphenyldiphenylsulfonium 2,3,4,5,6-pentakis(trifluoromethyl)benzenesulfonate, 2,4-di-t-butoxyphenyldiphenylsulfonium 4-fluorobenzenesulfonate, 2,4-di-t-butoxyphenyldiphenylsulfonium 2,4-difluorobenzenesulfonate, 2,4-di-t-butoxyphenyldiphenylsulfonium 2,6-difluorobenzenesulfonate, 2,4-di-t-butoxyphenyldiphenylsulfonium 2,3,4,5,6-pentafluorobenzenesulfonate, 2,4-di-t-butoxyphenyldiphenylsulfonium 4-trifluoromethylbenzenesulfonate, 2,4-di-t-butoxyphenyldiphenylsulfonium 2,4-bis(trifluoromethyl)benzenesulfonate, 2,4-di-t-butoxyphenyldiphenylsulfonium 2,4,6-tris(trifluoromethyl)benzenesulfonate, 2,4-di-t-butoxyphenyldiphenylsulfonium 2,3,4,5,6-pentakis(trifluoromethyl)benzenesulfonate, 2,6-di-t-butoxyphenyldiphenylsulfonium 4-fluorobenzenesulfonate, 2,6-di-t-butoxyphenyldiphenylsulfonium 2,4-difluorobenzenesulfonate, 2,6-di-t-butoxyphenyldiphenylsulfonium 2,6-difluorobenzenesulfonate, 2,6-di-t-butoxyphenyldiphenylsulfonium 2,3,4,5,6-pentafluorobenzenesulfonate, 2,6-di-t-butoxyphenyldiphenylsulfonium 4-trifluoromethylbenzenesulfonate, 2,6-di-t-butoxyphenyldiphenylsulfonium 2,4-bis(trifluoromethyl)benzenesulfonate, 2,6-di-t-butoxyphenyldiphenylsulfonium 2,4,6-tris(trifluoromethyl)benzenesulfonate, 2,6-di-t-butoxyphenyldiphenylsulfonium 2,3,4,5,6-pentakis(trifluoromethyl)benzenesulfonate, 3,5-di-t-butoxyphenyldiphenylsulfonium 4-fluorobenzenesulfonate, 3,5-di-t-butoxyphenyldiphenylsulfonium 2,4-difluorobenzenesulfonate, 3,5-di-t-butoxyphenyldiphenylsulfonium 2,6-difluorobenzenesulfonate, 3,5-di-t-butoxyphenyldiphenylsulfonium 2,3,4,5,6-pentafluorobenzenesulfonate, 3,5-di-t-butoxyphenyldiphenylsulfonium 4-trifluoromethylbenzenesulfonate, 3,5-di-t-butoxyphenyldiphenylsulfonium 2,4-bis(trifluoromethyl)benzenesulfonate, 3,5-di-t-butoxyphenyldiphenylsulfonium 2,4,6-tris(trifluoromethyl)benzenesulfonate, 3,5-di-t-butoxyphenyldiphenylsulfonium 2,3,4,5,6-pentakis(trifluoromethyl)benzenesulfonate, 2,4,6-tri-t-butoxyphenyldiphenylsulfonium 4-fluorobenzenesulfonate, 2,4,6-tri-t-butoxyphenyldiphenylsulfonium 2,4-difluorobenzenesulfonate, 2,4,6-tri-t-butoxyphenyldiphenylsulfonium 2,6-difluorobenzenesulfonate, 2,4,6-tri-t-butoxyphenyldiphenylsulfonium 2,3,4,5,6-pentafluorobenzenesulfonate, 2,4,6-tri-t-butoxyphenyldiphenylsulfonium 4-trifluoromethylbenzenesulfonate, 2,4,6-tri-t-butoxyphenyldiphenylsulfonium 2,4-bis(trifluoromethyl)benzenesulfonate, 2,4,6-tri-t-butoxyphenyldiphenylsulfonium 2,4,6-tris(trifluoromethyl)benzenesulfonate, 2,4,6-tri-t-butoxyphenyldiphenylsulfonium 2,3,4,5,6-pentakis(trifluoromethyl)benzenesulfonate, 2,4-di-t-butoxycarbonylmethoxyphenyldiphenylsulfonium 4-fluorobenzenesulfonate, 2,4-di-t-butoxycarbonylmethoxyphenyldiphenylsulfonium 2,4-difluorobenzenesulfonate, 2,4-di-t-butoxycarbonylmethoxyphenyldiphenylsulfonium 2,6-difluorobenzenesulfonate, 2,4-di-t-butoxycarbonylmethoxyphenyldiphenylsulfonium 2,3,4,5,6-pentafluorobenzenesulfonate, 2,4-di-t-butoxycarbonylmethoxyphenyldiphenylsulfonium 4-trifluoromethylbenzenesulfonate, 2,4-di-t-butoxycarbonylmethoxyphenyldiphenylsulfonium 2,4-bis(trifluoromethyl)benzenesulfonate, 2,4-di-t-butoxycarbonylmethoxyphenyldiphenylsulfonium 2,4,6-tris(trifluoromethyl)benzenesulfonate, 2,4-di-t-butoxycarbonylmethoxyphenyldiphenylsulfonium 2,3,4,5,6-pentakis(trifluoromethyl)benzenesulfonate, 2,6-di-t-butoxycarbonylmethoxyphenyldiphenylsulfonium 4-fluorobenzenesulfonate, 2,6-di-t-butoxycarbonylmethoxyphenyldiphenylsulfonium 2,4-difluorobenzenesulfonate, 2,6-di-t-butoxycarbonylmethoxyphenyldiphenylsulfonium 2,6-difluorobenzenesulfonate, 2,6-di-t-butoxycarbonylmethoxyphenyldiphenylsulfonium 2,3,4,5,6-pentafluorobenzenesulfonate, 2,6-di-t-butoxycarbonylmethoxyphenyldiphenylsulfonium 4-trifluoromethylbenzenesulfonate, 2,6-di-t-butoxycarbonylmethoxyphenyldiphenylsulfonium 2,4-bis(trifluoromethyl)benzenesulfonate, 2,6-di-t-butoxycarbonylmethoxyphenyldiphenylsulfonium 2,4,6-tris(trifluoromethyl)benzenesulfonate, 2,6-di-t-butoxycarbonylmethoxyphenyldiphenylsulfonium 2,3,4,5,6-pentakis(trifluoromethyl)benzenesulfonate, 3,5-di-t-butoxycarbonylmethoxyphenyldiphenylsulfonium 4-fluorobenzenesulfonate, 3,5-di-t-butoxycarbonylmethoxyphenyldiphenylsulfonium 2,4-difluorobenzenesulfonate, 3,5-di-t-butoxycarbonylmethoxyphenyldiphenylsulfonium 2,6-difluorobenzenesulfonate, 3,5-di-t-butoxycarbonylmethoxyphenyldiphenylsulfonium 2,3,4,5,6-pentafluorobenzenesulfonate, 3,5-di-t-butoxycarbonylmethoxyphenyldiphenylsulfonium 4-trifluoromethylbenzenesulfonate, 3,5-di-t-butoxycarbonylmethoxyphenyldiphenylsulfonium 2,4-bis(trifluoromethyl)benzenesulfonate, 3,5-di-t-butoxycarbonylmethoxyphenyldiphenylsulfonium 2,4,6-tris(trifluoromethyl)benzenesulfonate, 3,5-di-t-butoxycarbonylmethoxyphenyldiphenylsulfonium 2,3,4,5,6-pentakis(trifluoromethyl)benzenesulfonate, 2,4,6-tri-t-butoxycarbonylmethoxyphenyldiphenylsulfonium 4-fluorobenzenesulfonate, 2,4,6-tri-t-butoxycarbonylmethoxyphenyldiphenylsulfonium 2,4-difluorobenzenesulfonate, 2,4,6-tri-t-butoxycarbonylmethoxyphenyldiphenylsulfonium 2,6-difluorobenzenesulfonate, 2,4,6-tri-t-butoxycarbonylmethoxyphenyldiphenylsulfonium 2,3,4,5,6-pentafluorobenzenesulfonate, 2,4,6-tri-t-butoxycarbonylmethoxyphenyldiphenylsulfonium 4-trifluoromethylbenzenesulfonate, 2,4,6-tri-t-butoxycarbonylmethoxyphenyldiphenylsulfonium 2,4-bis(trifluoromethyl)benzenesulfonate, 2,4,6-tri-t-butoxycarbonylmethoxyphenyldiphenylsulfonium 2,4,6-tris(trifluoromethyl)benzenesulfonate, 2,4,6-tri-t-butoxycarbonylmethoxyphenyldiphenylsulfonium 2,3,4,5,6-pentakis(trifluoromethyl)benzenesulfonate, 4-t-butoxy-2,6-dimethylphenyldiphenylsulfonium 4-fluorobenzenesulfonate, 4-t-butoxy-2,6-dimethylphenyldiphenylsulfonium 2,4-difluorobenzenesulfonate, 4-t-butoxy-2,6-dimethylphenyldiphenylsulfonium 2,6-difluorobenzenesulfonate, 4-t-butoxy-2,6-dimethylphenyldiphenylsulfonium 2,3,4,5,6-pentafluorobenzenesulfonate, 4-t-butoxy-2,6-dimethylphenyldiphenylsulfonium 4-trifluoromethylbenzenesulfonate, 4-t-butoxy-2,6-dimethylphenyldiphenylsulfonium 2,4-bis(trifluoromethyl)benzenesulfonate, 4-t-butoxy-2,6-dimethylphenyldiphenylsulfonium 2,4,6-tris(trifluoromethyl)benzenesulfonate, 4-t-butoxy-2,6-dimethylphenyldiphenylsulfonium 2,3,4,5,6-pentakis(trifluoromethyl)benzenesulfonate, 4-t-butoxycarbonylmethoxy-2,6-dimethylphenyldiphenylsulfonium 4-fluorobenzenesulfonate, 4-t-butoxycarbonylmethoxy-2,6-dimethylphenyldiphenylsulfonium 2,4-difluorobenzenesulfonate, 4-t-butoxycarbonylmethoxy-2,6-dimethylphenyldiphenylsulfonium 2,6-difluorobenzenesulfonate, 4-t-butoxycarbonylmethoxy-2,6-dimethylphenyldiphenylsulfonium 2,3,4,5,6-pentafluorobenzenesulfonate, 4-t-butoxycarbonylmethoxy-2,6-dimethylphenyldiphenylsulfonium 4-trifluoromethylbenzenesulfonate, 4-t-butoxycarbonylmethoxy-2,6-dimethylphenyldiphenylsulfonium 2,4-bis(trifluoromethyl)benzenesulfonate, 4-t-butoxycarbonylmethoxy-2,6-dimethylphenyldiphenylsulfonium 2,4,6-tris(trifluoromethyl)benzenesulfonate, and 4-t-butoxycarbonylmethoxy-2,6-dimethylphenyldiphenylsulfonium 2,3,4,5,6-pentakis(trifluoromethyl)benzenesulfonate.

Of these acid generators (1), 2,4-dihydroxyphenyldiphenylsulfonium 2,4,6-tris(trifluoromethyl)benzenesulfonate, 2,4-dimethylphenyldiphenylsulfonium 2,3,4,5,6-pentakis(trifluoromethyl)benzenesulfonate, 2,4,6-trimethylphenyldiphenylsulfonium 2,4-difluorobenzenesulfonate, 2,4,6-trimethylphenyldiphenylsulfonium 4-trifluoromethylbenzenesulfonate, 2,4,6-triethylphenyldiphenylsulfonium 4-trifluoromethylbenzenesulfonate, 2,4,6-tri-i-propylphenyldiphenylsulfonium 2,4-difluorobenzenesulfonate, 4-t-butoxy-2,6-dimethylphenyldiphenylsulfonium 2,3,4,5,6-pentafluorobenzenesulfonate, 4-t-butoxycarbonylmethoxy-2,6-dimethylphenyldiphenylsulfonium 2,4,6-tris(trifluoromethyl)benzenesulfonate, or the like is preferable. Particularly, 2,4,6-trimethylphenyldiphenylsulfonium 2,4- difluorobenzenesulfonate, 2,4,6-trimethylphenyldiphenylsulfonium 4-trifluoromethylbenzenesulfonate, or the like is preferable.

In the present invention, these acid generators (1) can be used alone or as a mixture of two or more of them.

The acid generator (A) of the present invention comprises a sulfonimide compound in combination with the acid generator (1).

Examples of the sulfonimide compound include a compound represented by the following formula (6):

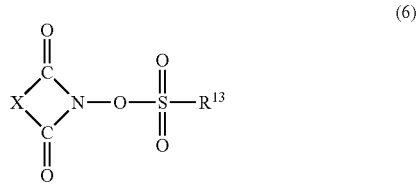

wherein, in the formula (6), X represents a divalent group such as an alkylene, arylene, or alkoxylene group, and $R^{13}$ represents a monovalent group such as an alkyl, aryl, halogen-substituted alkyl, or halogen-substituted aryl group.

Specific examples of the sulfonimide compound include N-(trifluoromethanesulfonyloxy)succinimide, N-(trifluoromethanesulfonyloxy)phthalimide, N-(trifluoromethanesulfonyloxy)diphenylmaleimide, N-(trifluoromethanesulfonyloxy)bicyclo[2.2.1]hept-5-ene-2,3-dicarboximide, N-(trifluoromethanesulfonyloxy)-7-oxabicyclo[2.2.1]hept-5-ene-2,3-dicarboximide, N-(trifluoromethanesulfonyloxy)bicyclo[2.2.1]heptane-5,6-oxy-2,3-dicarboximide, N-(trifluoromethanesulfonyloxy)naphthylimide, N-(nonafluoro-n-butanesulfonyloxy)succinimide, N-(nonafluoro-n-butanesulfonyloxy)phthalimide, N-(nonafluoro-n-butanesulfonyloxy)diphenylmaleimide, N-(nonafluoro-n-butanesulfonyloxy)bicyclo[2.2.1]hept-5-ene-2,3-dicarboximide, N-(nonafluoro-n-butanesulfonyloxy)-7-oxabicyclo[2.2.1]hept-5-ene-2,3-dicarboximide, N-(nonafluoro-n-butanesulfonyloxy)bicyclo[2.2.1]heptane-5,6-oxy-2,3-dicarboximide, N-(nonafluoro-n-butanesulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboximide, N-(10-camphorsulfonyloxy)-7-oxabicyclo[2.2.1]hept-5-ene-2,3-dicarboximide, N-(10-camphorsulfonyloxy)bicyclo[2.2.1]heptane-5,6-oxy-2,3-dicarboximide, N-(10-camphorsulfonyloxy)naphthylimide, N-(4-methylbenzenesulfonyloxy)succinimide, N-(4-methylbenzenesulfonyloxy)phthalimide, N-(4-methylbenzenesulfonyloxy)diphenylmaleimide, N-(4-methylbenzenesulfonyloxy)bicyclo[2.2.1]hept-5-ene-2,3-dicarboximide, N-(4-methylbenzenesulfonyloxy)-7-oxabicyclo[2.2.1]hept-5-ene-2,3-dicarboximide, N-(4-methylbenzenesulfonyloxy)bicyclo[2.2.1]heptane-5,6-oxy-2,3-dicarboximide, N-(4-methylbenzenesulfonyloxy)naphthylimide, N-(2-trifluoromethylbenzenesulfonyloxy)succinimide, N-(2-trifluoromethylbenzenesulfonyloxy)phthalimide, N-(2-trifluoromethylbenzenesulfonyloxy)diphenylmaleimide, N-(2-trifluoromethylbenzenesulfonyloxy)bicyclo[2.2.1]hept-5-ene-2,3-dicarboximide, N-(2-trifluoromethylbenzenesulfonyloxy)-7-oxabicyclo[2.2.1]hept-5-ene-2,3-dicarboximide, N-(2-trifluoromethylbenzenesulfonyloxy)bicyclo[2.2.1]heptane-5,6-oxy-2,3-dicarboximide, N-(2-trifluoromethylbenzenesulfonyloxy)naphthylimide, N-(4-fluorobenzenesulfonyloxy)succinimide, N-(4-fluorobenzenesulfonyloxy)phthalimide, N-(4-fluorobenzenesulfonyloxy)diphenylmaleimide, N-(4-fluorobenzenesulfonyloxy)bicyclo[2.2.1]hept-5-ene-2,3-dicarboximide, N-(4-fluorobenzenesulfonyloxy)-7-oxabicyclo[2.2.1]hept-5-ene-2,3-dicarboximide, N-(4-fluorobenzenesulfonyloxy)bicyclo[2.2.1]heptane-5,6-oxy-2,3-dicarboximide, N-(4-fluorobenzenesulfonyloxy)naphthylimide, N-[(5-methyl-5-carboxymethylbicyclo[2.2.1]heptane-2-yl)sulfonyloxy]succinimide, N-[(5-methyl-5-carboxymethylbicyclo[2.2.1]heptane-2-yl)sulfonyloxy]phthalimide, N-[(5-methyl-5-carboxymethylbicyclo[2.2.1]heptane-2-yl)sulfonyloxy]diphenylmaleimide, N-[(5-methyl-5-carboxymethylbicyclo[2.2.1]heptane-2-yl)sulfonyloxy]bicyclo[2.2.1]hept-5-ene-2,3-dicarboximide, N-[(5-methyl-5-carboxymethylbicyclo[2.2.1]heptane-2-yl)sulfonyloxy]-7-oxabicyclo[2.2.1]hept-5-ene-2,3-dicarboximide, N-[(5-methyl-5-carboxymethylbicyclo[2.2.1]heptane-2-yl)sulfonyloxy]bicyclo[2.2.1]heptane-5,6-oxy-2,3-dicarboximide, and N-[(5-methyl-5-carboxymethylbicyclo[2.2.1]heptane-2-yl)sulfonyloxy]naphthylimide.

In the present invention, these sulfonimide compounds can be used alone or as a mixture of two or more of them.

In the present invention, the acid generator (A) can further comprise, optionally, an acid generator (hereinafter, an "additional acid generator") other than the acid generator (1) and the sulfonimide compound.

Examples of the additional acid generator include onium salt compounds, sulfone compounds, sulfonic acid ester compounds, diazomethane compounds, and oxime sulfonate compounds.

Hereinafter, these additional acid generators will be described.

Onium Salt Compounds:

Examples of the onium salt compounds include iodonium salt, sulfonium salt, phosphonium salt, diazonium salt, ammonium salt, and pyridinium salt.

Specific examples of the onium salt compounds include bis(p-t-butylphenyl)iodonium trifluoromethanesulfonate, bis(p-t-butylphenyl)iodonium nonafluoro-n-butanesulfonate, bis(p-t-butylphenyl)iodonium o-trifluoromethylbenzenesulfonate, bis(p-t-butylphenyl)iodonium p-trifluoromethylbenzenesulfonate, bis(p-t-butylphenyl)iodonium 10-camphorsulfonate, bis(p-t-butylphenyl)iodonium p-toluenesulfonate, bis(p-t-butylphenyl)iodonium pyrenesulfonate, bis(p-t-butylphenyl)iodonium n-dodecylbenzenesulfonate, bis(p-t-butylphenyl)iodonium benzenesulfonate, bis(p-t-butylphenyl)iodonium 2,4-difluorobenzenesulfonate, bis(p-t-butylphenyl)iodonium n-octanesulfonate, diphenyliodonium trifluoromethanesulfonate, diphenyliodonium nonafluoro-n-butanesulfonate, diphenyliodonium o-trifluoromethylbenzenesulfonate, diphenyliodonium p-trifluoromethylbenzenesulfonate, diphenyliodonium 10-camphorsulfonate, diphenyliodonium p-toluenesulfonate, diphenyliodonium pyrenesulfonate, diphenyliodonium n-dodecylbenzenesulfonate, diphenyliodonium benzenesulfonate, diphenyliodonium 2,4-difluorobenzenesulfonate, diphenyliodonium n-octanesulfonate, triphenylsulfonium trifluoromethanesulfonate, triphenylsulfonium nonafluoro-n-butanesulfonate, triphenylsulfonium o-trifluoromethylbenzenesulfonate, triphenylsulfonium p-trifluoromethylbenzenesulfonate, triphenylsulfonium 10-camphorsulfonate, triphenylsulfonium p-toluenesulfonate, triphenylsulfonium pyrenesulfonate, triphenylsulfonium n-dodecylbenzenesulfonate, triphenylsulfonium benzenesulfonate, triphenylsulfonium 2,4-difluorobenzenesulfonate, triphenylsulfonium n-octanesulfonate, p-methylphenyldiphenylsulfonium trifluoromethanesulfonate, p-methylphenyldiphenylsulfonium nonafluoro-n-butanesulfonate, p-methylphenyldiphenylsulfonium o-trifluoromethylbenzenesulfonate, p-methylphenyldiphenylsulfonium p-trifluoromethylbenzenesulfonate, p-methylphenyldiphenylsulfonium 10-camphorsulfonate, p-methylphenyldiphenylsulfonium p-toluenesulfonate, p-methylphenyldiphenylsulfonium pyrenesulfonate, p-methylphenyldiphenylsulfonium n-dodecylbenzenesulfonate, p-methylphenyldiphenylsulfonium benzenesulfonate, p-methylphenyldiphenylsulfonium 2,4-difluorobenzenesulfonate, p-methylphenyldiphenylsulfonium n-octanesulfonate, p-ethylphenyldiphenylsulfonium trifluoromethanesulfonate, p-ethylphenyldiphenylsulfonium nonafluoro-n-butanesulfonate, p-ethylphenyldiphenylsulfonium o-trifluoromethylbenzenesulfonate, p-ethylphenyldiphenylsulfonium p-trifluoromethylbenzenesulfonate, p-ethylphenyldiphenylsulfonium 10-camphorsulfonate, p-ethylphenyldiphenylsulfonium p-toluenesulfonate, p-ethylphenyldiphenylsulfonium pyrenesulfonate, p-ethylphenyldiphenylsulfonium n-dodecylbenzenesulfonate, p-ethylphenyldiphenylsulfonium benzenesulfonate, p-ethylphenyldiphenylsulfonium 2,4-difluorobenzenesulfonate, p-ethylphenyldiphenylsulfonium n-octanesulfonate, p-i-propylphenyldiphenylsulfonium trifluoromethanesulfonate, p-i-propylphenyldiphenylsulfonium nonafluoro-n-butanesulfonate, p-i-propylphenyldiphenylsulfonium o-trifluoromethylbenzenesulfonate, p-i-propylphenyldiphenylsulfonium p-trifluoromethylbenzenesulfonate, p-i-propylphenyldiphenylsulfonium 10-camphorsulfonate, p-i-propylphenyldiphenylsulfonium p-toluenesulfonate, p-i-propylphenyldiphenylsulfonium pyrenesulfonate, p-i-propylphenyldiphenylsulfonium n-dodecylbenzenesulfonate, p-i-propylphenyldiphenylsulfonium benzenesulfonate, p-i-propylphenyldiphenylsulfonium 2,4-difluorobenzenesulfonate, p-i-propylphenyldiphenylsulfonium n-octanesulfonate, p-t-butylphenyldiphenylsulfonium trifluoromethanesulfonate, p-t-butylphenyldiphenylsulfonium nonafluoro-n-butanesulfonate, p-t-butylphenyldiphenylsulfonium o-trifluoromethylbenzenesulfonate, p-t-butylphenyldiphenylsulfonium p-trifluoromethylbenzenesulfonate, p-t-butylphenyldiphenylsulfonium 10-camphorsulfonate, p-t-butylphenyldiphenylsulfonium p-toluenesulfonate, p-t-butylphenyldiphenylsulfonium pyrenesulfonate, p-t-butylphenyldiphenylsulfonium n-dodecylbenzenesulfonate, p-t-butylphenyldiphenylsulfonium benzenesulfonate, p-t-butylphenyldiphenylsulfonium 2,4-difluorobenzenesulfonate, p-t-butylphenyldiphenylsulfonium n-octanesulfonate, p-methoxyphenyldiphenylsulfonium trifluoromethanesulfonate, p-methoxyphenyldiphenylsulfonium nonafluoro-n-butanesulfonate, p-methoxyphenyldiphenylsulfonium o-trifluoromethylbenzenesulfonate, p-methoxyphenyldiphenylsulfonium p-trifluoromethylbenzenesulfonate, p-methoxyphenyldiphenylsulfonium 10-camphorsulfonate, p-methoxyphenyldiphenylsulfonium p-toluenesulfonate, p-methoxyphenyldiphenylsulfonium pyrenesulfonate, p-methoxyphenyldiphenylsulfonium n-dodecylbenzenesulfonate, p-methoxyphenyldiphenylsulfonium benzenesulfonate, p-methoxyphenyldiphenylsulfonium 2,4-difluorobenzenesulfonate, p-methoxyphenyldiphenylsulfonium n-octanesulfonate, p-t-butoxyphenyldiphenylsulfonium trifluoromethanesulfonate, p-t-butoxyphenyldiphenylsulfonium nonafluoro-n-butanesulfonate, p-t-butoxyphenyldiphenylsulfonium o-trifluoromethylbenzenesulfonate, p-t-butoxyphenyldiphenylsulfonium p-trifluoromethylbenzenesulfonate, p-t-butoxyphenyldiphenylsulfonium 10-camphorsulfonate, p-t-butoxyphenyldiphenylsulfonium p-toluenesulfonate, p-t-butoxyphenyldiphenylsulfonium pyrenesulfonate, p-t-butoxyphenyldiphenylsulfonium n-dodecylbenzenesulfonate, p-t-butoxyphenyldiphenylsulfonium benzenesulfonate, p-t-butoxyphenyldiphenylsulfonium 2,4-difluorobenzenesulfonate, p-t-butoxyphenyldiphenylsulfonium n-octanesulfonate, p-t-butoxycarbonylmethoxyphenyldiphenylsulfonium trifluoromethanesulfonate, p-t-butoxycarbonylmethoxyphenyldiphenylsulfonium nonafluoro-n-butanesulfonate, p-t-butoxycarbonylmethoxyphenyldiphenylsulfonium o-trifluoromethylbenzenesulfonate, p-t-butoxycarbonylmethoxyphenyldiphenylsulfonium p-trifluoromethylbenzenesulfonate, p-t-butoxycarbonylmethoxyphenyldiphenylsulfonium 10-camphorsulfonate, p-t-butoxycarbonylmethoxyphenyldiphenylsulfonium p-toluenesulfonate, p-t-butoxycarbonylmethoxyphenyldiphenylsulfonium pyrenesulfonate, p-t-butoxycarbonylmethoxyphenyldiphenylsulfonium n-dodecylbenzenesulfonate, p-t-butoxycarbonylmethoxyphenyldiphenylsulfonium benzenesulfonate, p-t-butoxycarbonylmethoxyphenyldiphenylsulfonium 2,4-difluorobenzenesulfonate, and p-t-butoxycarbonylmethoxyphenyldiphenylsulfonium n-octanesulfonate.

Sulfone Compounds:

Examples of the sulfone compounds include β-ketosulfone and β-sulfonylsulfone.

Specific examples of the sulfone compounds include phenacylphenylsulfone, mesitylphenacylsulfone, bis(phenylsulfonyl)methane, 1,1-bis(phenylsulfonyl)cyclopentane, 1,1-bis(phenylsulfonyl)cyclohexane, and 4-trisphenacylsulfone.

Sulfonic Acid Ester Compounds:

Examples of the sulfonic acid ester compounds include alkyl sulfonate ester, haloalkyl sulfonate ester, aryl sulfonate ester, and imino sulfonate ester.

Specific examples of the sulfonic acid ester compounds include benzointosylate, pyrogallol tristrifluoromethanesulfonate, pyrogallol trimethanesulfonate triester, nitrobenzyl-9,10-diethoxyanthracene-2-sulfonate, α-methylolbenzointosylate, α-methylolbenzoin n-octanesulfonate, α-methylolbenzoin n-dodecanesulfonate, and α-methylolbenzoin trifluoromethanesulfonate.

Diazomethane Compounds:

Examples of the diazomethane compounds include a compound represented by the following formula (7):

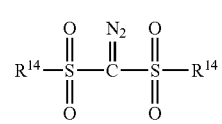

(7)

wherein, in the formula (7), each $R^{14}$ independently represents a linear, branched, or cyclic alkyl group having 1 to 20 carbon atoms, an aryl group having 6 to 20 carbon atoms, an aralkyl group having 7 to 20 carbon atoms, or any of other monovalent organic groups having a hetero-atom and 1 to 20 carbon atoms, and these alkyl, aryl, and aralkyl groups may be substituted.

Specific examples of the diazomethane compounds include bis(trifluoromethylsulfonyl)diazomethane, bis(t-butylsulfonyl)diazomethane, bis(cyclohexylsulfonyl)diazomethane, bis(phenylsulfonyl)diazomethane, bis(p-methylphenylsulfonyl)diazomethane, bis(1,4-dioxaspiro[4.5]decane-7-sulfonyl)diazomethane, bis(1,5-dioxaspiro[5.5]undecane-8-sulfonyl)diazomethane, bis(3,3-dimethyl-1,5-dioxaspiro[5.5]undecane-8-sulfonyl)diazomethane, methylsulfonyl cyclohexylsulfonyldiazomethane, methylsulfonyl phenylsulfonyldiazomethane, methylsulfonyl p-methylphenylsulfonyldiazomethane, t-butylsulfonyl cyclohexylsulfonyldiazomethane, t-butylsulfonyl phenylsulfonyldiazomethane, t-butylsulfonyl p-methylphenylsulfonyldiazomethane, cyclohexylsulfonyl 1,4-dioxaspiro[4.5]decane-7-sulfonyldiazomethane, cyclohexylsulfonyl 1,5-dioxaspiro[5.5]undecane-8-sulfonyldiazomethane, and cyclohexylsulfonyl 3,3-dimethyl-1,5-dioxaspiro[5.5]undecane-8-sulfonyldiazomethane.

Oxime Sulfonate Compounds:

Examples of the oxime sulfonate compounds include (5-n-propylsulfonyloxyimino-5H-thiophen-2-ylidene)-(2-methylphenyl)acetonitrile and 2,2,2-trifluoro-1-[4-{3-(4-[2,2,2-trifluoro-1-(1-n-propanesulfonyloxyimino)ethyl]phenoxy)n-propoxy}phenyl]ethanone oxime 1-n-propanesulfonate.

In the present invention, these additional acid generators can be used alone or as a mixture of two or more of them.

In the present invention, the amount of the acid generator (A) used is usually 0.01 to 20 parts by weight, preferably 0.1 to 15 parts by weight, particularly preferably 0.3 to 8 parts by weight, with respect to 100 parts by weight of a resin (B) described later. In this case, if the amount of the acid generator (A) used is less than the given range, fluctuations in line width and deterioration in pattern profile attributed to standing waves may occur. On the other hand, if the amount of the acid generator (A) used exceeds the given range, a pattern profile may become a forward tapered form.

Moreover, the proportion of the sulfonimide compound used is usually 0.1 to 20% by weight, preferably 1 to 15% by weight, with respect to the whole acid generator (A). In this case, if the proportion of the sulfonimide compound used is less than the given range, deterioration in resolution or line edge roughness (LER) may occur. On the other hand, if the proportion of the sulfonimide compound used exceeds the given range, a pattern profile may become a T-top form.

Moreover, the proportion of the additional acid generator used is usually 5% by weight or less, preferably 3% by weight or less, with respect to the whole acid generator (A). In this case, if the proportion of the additional acid generator used exceeds the given value, the intended effects of the present invention may be reduced.

Resin Component

The radiation-sensitive resin composition of the present invention usually comprises a resin component in addition to the acid generator (A).

Examples of the resin component include (i) a resin insoluble or scarcely soluble in alkali having an acid-labile group, which resin becomes readily soluble in alkali by the dissociation of the acid-labile group (hereinafter, referred to as an "acid-labile group-containing resin"), (ii) a mixture of an alkali-soluble resin and a dissolution controller, and (iii) a mixture of an alkali-soluble resin and a crosslinking agent capable of crosslinking the alkali-soluble resin in the presence of an acid. Preferably, the acid-labile group-containing resin is used.

Hereinafter, the acid-labile group-containing resin will be described.

The phrase "insoluble or scarcely soluble in alkali" described for the acid-labile group-containing resin means a property by which 50% or more of the initial thickness of a film obtained using only the acid-labile group-containing resin instead of a resist film remains after development under alkaline development conditions adopted for forming a resist pattern using a resist film formed from the radiation-sensitive resin composition comprising the acid-labile group-containing resin.

The acid-labile group-containing resin of the present invention is not particularly limited. Preferable examples thereof include a resin (hereinafter, referred to as a "resin (B)") having a recurring unit represented by the following formula (2) (hereinafter, referred to as a "recurring unit (2)"), a recurring unit represented by the following formula (3) (hereinafter, referred to as a "recurring unit (3)"), and/or a recurring unit represented by the following formula (4) (hereinafter, referred to as a "recurring unit (4)"):

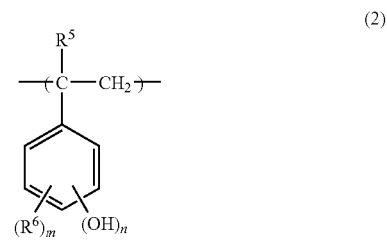

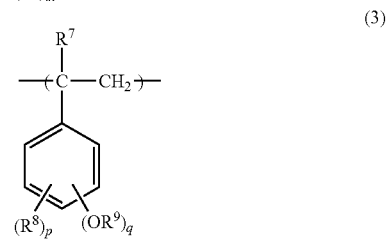

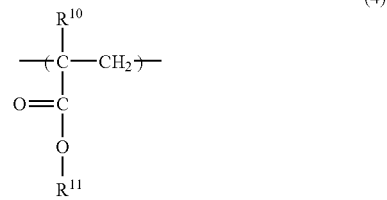

wherein, in the formula (2), $R^5$ represents a hydrogen atom or a methyl group, $R^6$ represents a monovalent organic group except for a t-butoxy group and —O—Z (Z is a monovalent acid-labile group other than a t-butyl group), m is any integer of 0 to 3, n is any integer of 1 to 3, and a plurality of the $R^6$ moieties may be the same as or different from each other, wherein, in the formula (3), $R^7$ represents a hydrogen atom or a methyl group, $R^8$ represents a monovalent organic group except for a t-butoxy group and —O—Z (Z is a monovalent acid-labile group other than a t-butyl group), $R^9$ represents a t-butyl group, p is any integer of 0 to 3, q is any integer of 1 to 3, and a plurality of the $R^8$ moieties may be the same as or different from each other, and wherein, in the formula (4), $R^{10}$ represents a hydrogen atom or a methyl group, and $R^{11}$ represents a t-butyl group.

Examples of the monovalent organic group represented by $R^6$ in the formula (2) and $R^B$ in the formula (3) include a linear, branched, or cyclic alkyl group having 1 to 12 carbon atoms, a monovalent aromatic hydrocarbon group having 6 to 20 carbon atoms, a monovalent organic group containing an oxygen atom, and a monovalent organic group containing a nitrogen atom.

Examples of the alkyl group include methyl, ethyl, n-propyl, i-propyl, n-butyl, 2-methylpropyl, 1-methylpropyl, t-butyl, cyclopentyl, and cyclohexyl groups.

Alternatively, examples of the monovalent aromatic hydrocarbon group include phenyl, o-tolyl, m-tolyl, p-tolyl, 2,4-xylyl, 2,6-xylyl, 3,5-xylyl, mesityl, o-cumenyl, m-cumenyl, p-cumenyl, benzyl, phenethyl, 1-naphthyl, and 2-naphthyl groups.

Alternatively, examples of the monovalent organic group containing an oxygen group include:

a carboxyl group;

linear, branched, or cyclic hydroxyalkyl groups having 1 to 8 carbon atoms such as hydroxymethyl, 1-hydroxyethyl, 2-hydroxyethyl, 1-hydroxypropyl, 2-hydroxypropyl, 3-hydroxypropyl, 1-hydroxybutyl, 2-hydroxybutyl, 3-hydroxybutyl, 4-hydroxybutyl, 3-hydroxycyclopentyl, and 4-hydroxycyclohexyl groups;

linear, branched, or cyclic alkoxyl groups having 1 to 8 carbon atoms such as methoxy, ethoxy, n-propoxy, i-propoxy, n-butoxy, 2-methylpropoxy, 1-methylpropoxy, t-butoxy, cyclopentyloxy, and cyclohexyloxy groups;

linear alkoxycarbonyloxy groups having 2 to 9 carbon atoms such as methoxycarbonyloxy, ethoxycarbonyloxy, n-propoxycarbonyloxy, and n-butoxycarbonyloxy groups;

linear, branched, or cyclic (1-alkoxyalkoxy)alkyl groups having 3 to 10 carbon atoms such as (1-methoxyethoxy)methyl, (1-ethoxyethoxy)methyl, (1-n-propoxyethoxy)methyl, (1-n-butoxyethoxy)methyl, (1-cyclopentyloxyethoxy)methyl, (1-cyclohexyloxyethoxy)methyl, (1-methoxypropoxy)methyl, and (1-ethoxypropoxy)methyl groups; and linear, branched, or cyclic alkoxycarbonyloxyalkyl groups having 3 to 10 carbon atoms such as methoxycarbonyloxymethyl, ethoxycarbonyloxymethyl, n-propoxycarbonyloxymethyl, i-propoxycarbonyloxymethyl, n-butoxycarbonyloxymethyl, t-butoxycarbonyloxymethyl, cyclopentyloxycarbonyloxymethyl, and cyclohexyloxycarbonyloxymethyl groups.

Alternatively, examples of the monovalent organic group containing a nitrogen atom include: a cyano group; and linear, branched, or cyclic cyanoalkyl groups having 2 to 9 carbon atoms such as cyanomethyl, 1-cyanoethyl, 2-cyanoethyl, 1-cyanopropyl, 2-cyanopropyl, 3-cyanopropyl, 1-cyanobutyl, 2-cyanobutyl, 3-cyanobutyl, 4-cyanobutyl, 3-cyanocyclopentyl, and 4-cyanocyclohexyl groups.

Examples of the recurring unit (2) preferably used in the present invention include a recurring unit obtained by the cleavage of a polymerizable unsaturated bond in compounds such as 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, and 2,4,6-trihydroxystyrene.

In the resin (B), these recurring units (2) can be present alone or in combination of two or more of them.

Moreover, examples of the recurring unit (3) preferably used in the present invention include a recurring unit obtained by the cleavage of a polymerizable unsaturated bond in compounds such as 2-t-butoxystyrene, 3-t-butoxystyrene, 4-t-butoxystyrene, 2-t-butoxy-α-methylstyrene, 3-t-butoxy-α-methylstyrene, 4-t-butoxy-α-methylstyrene, 2-methyl-4-t-butoxystyrene, and 3-methyl-4-t-butoxystyrene.

In the resin (B), these recurring units (3) can be present alone or in combination of two or more of them.

Moreover, the recurring unit (4) is a unit derived from t-butyl acrylate or t-butyl methacrylate. Both of these units are preferable.

In the resin (B), these recurring units (4) can be present alone or in combination of two or more of them.

The resin (B) can further have a recurring unit (hereinafter, referred to as an "additional recurring unit") other than the recurring units (2) to (4).

Examples of the additional recurring unit include a unit obtained by the cleavage of a polymerizable unsaturated bond in a compound (hereinafter, referred to as an "additional acid-labile group-containing styrene compound") in which the hydrogen atom of a phenolic hydroxyl group in the hydroxystyrenes or α-methylstyrenes that give the recurring unit (2) is substituted by a monovalent acid-labile group except for a t-butyl group as well as a unit obtained by the cleavage of a polymerizable unsaturated bond in compounds such as vinyl aromatic compounds such as styrene, α-methylstyrene, 2-methylstyrene, 3-methylstyrene, 4-methylstyrene, 2-methoxystyrene, 3-methoxystyrene, 4-methoxystyrene, and 4-(2-t-butoxycarbonylethyloxy)styrene;

(meth)acrylic acid esters such as methyl(meth)acrylate, ethyl (meth)acrylate, n-propyl(meth)acrylate, i-propyl (meth)acrylate, n-butyl(meth)acrylate, 2-methylpropyl (meth)acrylate, 1-methylpropyl(meth)acrylate, n-pentyl (meth)acrylate, neopentyl(meth)acrylate, n-hexyl (meth)acrylate, 2-ethylhexyl (meth)acrylate, 2-hydroxyethyl (meth)acrylate, 2-hydroxypropyl(meth)acrylate, 3-hydroxypropyl(meth)acrylate, phenyl(meth)acrylate, benzyl (meth)acrylate, 1-methylcyclopentyl(meth)acrylate, 1-ethylcyclopentyl(meth)acrylate, 1-methyladamantyl (meth)acrylate, 1-ethyladamantyl(meth)acrylate, 8-methyl-8-tricyclodecyl(meth)acrylate, 8-ethyl-8-tricyclodecyl (meth)acrylate, 3-methyl-3-tetracyclododecenyl(meth)acrylate, 3-ethyl-3-tetracyclododecenyl(meth)acrylate, and 2,5-dimethylhexane-2,5-di(meth)acrylate;

unsaturated carboxylic acids (anhydrides) such as (meth) acrylic acid, crotonic acid, maleic acid, maleic anhydrides, fumaric acid, and cinnamic acid;

carboxyalkyl esters of unsaturated carboxylic acid such as 2-carboxyethyl(meth)acrylate, 2-carboxypropyl(meth)acrylate, and 3-carboxypropyl(meth)acrylate;

unsaturated nitryl compounds such as (meth)acrylonitrile, α-chloroacrylonitrile, crotonitrile, maleinitrile, and fumaronitrile;

unsaturated amide compounds such as (meth)acrylamide, N,N-dimethyl(meth)acrylamide, crotonamide, maleinamide, and fumaramide;

unsaturated imide compounds such as maleimide, N-phenylmaleimide, and N-cyclohexylmaleimide; and other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole.

Examples of the monovalent acid-labile group in the additional acid-labile group-containing styrene compound include substituted methyl, 1-substituted ethyl, 1-branched alkyl, triorganosilyl, triorganogermyl, alkoxycarbonyl, acyl, and monovalent cyclic acid-labile groups.

Examples of the substituted methyl group include methoxymethyl, methylthiomethyl, ethoxymethyl, ethylthiomethyl, (2-methoxyethoxy)methyl, benzyloxymethyl, benzylthiomethyl, phenacyl, bromophenacyl, methoxyphenacyl, methylthiophenacyl, α-methylphenacyl, cyclopropylmethyl, benzyl, diphenylmethyl, triphenylmethyl, bromobenzyl, nitrobenzyl, methoxybenzyl, methylthiobenzyl, ethoxybenzyl, ethylthiobenzyl, piperonyl, methoxycarbonylmethyl, ethoxycarbonylmethyl, n-propoxycarbonylmethyl, i-propoxycarbonylmethyl, n-butoxycarbonylmethyl, and t-butoxycarbonylmethyl groups.

Examples of the 1-substituted ethyl group include 1-methoxyethyl, 1-methylthioethyl, 1,1-dimethoxyethyl, 1-ethoxyethyl, 1-ethylthioethyl, 1,1-diethoxyethyl, 1-ethoxypropyl, 1-propoxyethyl, 1-cyclohexyloxyethyl, 1-phenoxyethyl, 1-phenylthioethyl, 1,1-diphenoxyethyl, 1-benzyloxyethyl, 1-benzylthioethyl, 1-cyclopropylethyl, 1-phenylethyl, 1,1-diphenylethyl, 1-methoxycarbonylethyl, 1-ethoxycarbonylethyl, 1-n-propoxycarbonylethyl, 1-i-propoxycarbonylethyl, 1-n-butoxycarbonylethyl, and 1-t-butoxycarbonylethyl groups.

Examples of the 1-branched alkyl group include i-propyl, 1-methylpropyl, 1,1-dimethylpropyl, 1-methylbutyl, and 1,1-dimethylbutyl groups.

Examples of the triorganosilyl group include trimethylsilyl, ethyldimethylsilyl, methyldiethylsilyl, triethylsilyl, i-propyldimethylsilyl, methyl-di-i-propylsilyl, tri-i-propylsilyl, t-butyldimethylsilyl, methyl-di-t-butylsilyl, tri-t-butylsilyl, phenyldimethylsilyl, methyldiphenylsilyl, and triphenylsilyl groups.

Examples of the triorganogermyl group include trimethylgermyl, ethyldimethylgermyl, methyldiethylgermyl, triethylgermyl, i-propyldimethylgermyl, methyl-di-i-propylgermyl, tri-i-propylgermyl, t-butyldimethylgermyl, methyl-di-t-butylgermyl, tri-t-butylgermyl, phenyldimethylgermyl, methyldiphenylgermyl, and triphenylgermyl groups.

Examples of the alkoxycarbonyl group include methoxycarbonyl, ethoxycarbonyl, i-propoxycarbonyl, and t-butoxycarbonyl groups.

Examples of the acyl group include acetyl, propionyl, butyryl, heptanoyl, hexanoyl, valeryl, pivaloyl, isovaleryl, lauroyl, myristoyl, palmitoyl, stearoyl, oxalyl, malonyl, succinyl, glutaryl, adipoyl, piperoyl, suberoyl, azelaoyl, sebacoyl, acryloyl, propioloyl, methacryloyl, crotonoyl, oleoyl, maleoyl, fumaroyl, mesaconoyl, camphoroyl, benzoyl, phthaloyl, isophthaloyl, terephthaloyl, naphthoyl, toluoyl, hydroatropoyl, atropoyl, cinnamoyl, furoyl, thenoyl, nicotinoyl, isonicotinoyl, p-toluenesulfonyl, and mesyl groups.

Furthermore, examples of the monovalent cyclic acid-labile group include cyclopropyl, cyclopentyl, cyclohexyl, cyclohexenyl, 4-methoxycyclohexyl, tetrahydrofuranyl, tetrahydropyranyl, tetrahydrothiofuranyl, tetrahydrothiopyranyl, 3-bromotetrahydropyranyl, 4-methoxytetrahydropyranyl, 4-methoxytetrahydrothiopyranyl, and 3-tetrahydrothiophene-1,1-dioxide groups.

Of these monovalent acid-labile groups, a benzyl, 1-methoxyethyl, 1-ethoxyethyl, trimethylsilyl, t-butoxycarbonyl, t-butoxycarbonylmethyl, tetrahydrofuranyl, tetrahydropyranyl, tetrahydrothiofuranyl, or tetrahydrothiopyranyl group, or the like is preferable.

Examples of the additional recurring unit preferably used in the present invention include a unit obtained by the cleavage of a polymerizable unsaturated bond in compounds such as 4-(1-ethoxyethoxy)styrene, 4-(1-ethoxyethoxy)-α-methylstyrene, 4-(2-ethyl-2-propoxy)styrene, 4-(2-ethyl-2-propoxy)-α-methylstyrene, and styrene.

In the resin (B), these additional recurring units can be present alone or in combination of two or more of them.

The resin (B) can further have a branch unit (hereinafter, referred to as an "acid-labile branch unit") in which two or more structural units formed by the cleavage of a polymerizable unsaturated bond are bound via an acid-labile linking group.

The resin (B) having such an acid-labile branch unit gives a resin solution with lower viscosity than that given by a branch unit-free linear resin. As a result, a higher-molecular-weight resin is produced, leading to further improvement in heat resistance as a resist and improvement in resolution. Furthermore, the molecular chain mobility of the polymer is reduced, leading to suppression of thermal deformation and improvement in heat resistance. In addition, the acid-labile linking group is dissociated by the action of an acid such that the branch unit in the resin is cleaved to produce a lower-molecular-weight resin, leading to further improvement in the solubility of the resin in the presence of an acid and improvement in resolution.

Examples of the acid-labile linking group preferably used in the acid-labile branch unit include a divalent ester group represented by the following formula (8) and a divalent carbonate group represented by the following formula (9):

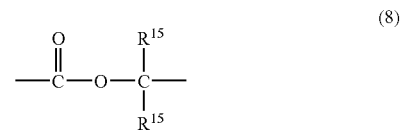

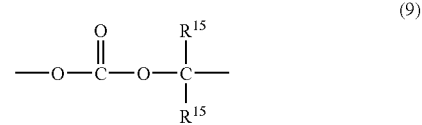

wherein, in the formulas (8) and (9), each $R^{15}$ independently represents an alkyl group having 1 to 5 carbon atoms or an aryl group having 6 to 14 carbon atoms.

A polymerizable unsaturated monomer that gives the acid-labile branch unit having the divalent ester group represented by the formula (8) can be synthesized, for example, by performing the esterification reaction of any of polyhydric alcohols represented by the following formulas (10) to (12) with monovalent carboxylic acid having one polymerizable unsaturated bond:

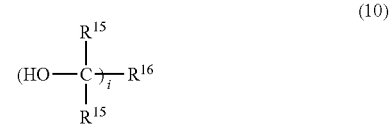

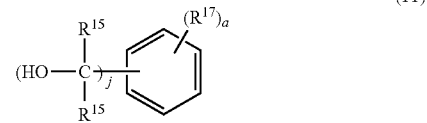

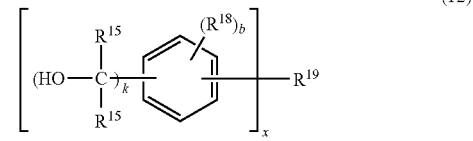

wherein, in the formula (10), each $R^{15}$ is the same as each $R^{15}$ in the formulas (8) and (9), $R^{16}$ represents an i-valent organic group (provided that it can have one or more primary or secondary hydroxyl groups) or represents a single bond for i=2, and i is any integer of 2 to 4, wherein, in the formula (11), each $R^{15}$ is the same as each $R^{15}$ in the formulas (8) and (9), $R^{17}$ represents an alkyl group having 1 to 5 carbon atoms (provided that it can have one or more primary or secondary hydroxyl groups), j is any integer of 2 to 4, a is any integer of 0 to 4, and (j+a)≦6, and wherein, in the formula (12), each $R^{15}$ is the same as each $R^{15}$ in the formulas (8) and (9), $R^{18}$ represents an alkyl group having 1 to 5 carbon atoms (provided that it can have one or more primary or secondary hydroxyl groups), $R^{19}$ represents an x-valent organic group (provided that it can have one or more primary or secondary hydroxyl groups), —O—, —S—, —CO—, or —SO$_2$—, k is 1 or 2, b is any integer of 0 to 3, and x is any integer of 2 to 4.

Alternatively, a polymerizable unsaturated monomer that gives the acid-labile branch unit having the divalent carbonate group represented by the formula (9) can be synthesized, for example, by converting any of the polyhydric alcohols represented by the formulas (10) to (12) into poly(chloroformate) by use of phosgene or the like and performing the esterification reaction of this poly(chloroformate) with a monohydric alcohol having one polymerizable unsaturated bond.

Examples of the polyhydric alcohol represented by the formula (10) include: dihydric alcohols such as 2,3-dimethyl-2,3-butanediol, 2,3-diethyl-2,3-butanediol, 2,3-di-n-propyl-2,3-butanediol, 2,3-diphenyl-2,3-butanediol, 2,4-dimethyl-2,4-pentanediol, 2,4-diethyl-2,4-pentanediol, 2,4-di-n-propyl-2,4-pentanediol, 2,4-diphenyl-2,4-pentanediol, 2,5-dimethyl-2,5-hexanediol, 2,5-diethyl-2,5-hexanediol, 2,5-di-n-propyl-2,5-hexanediol, 2,5-diphenyl-2,5-hexanediol, 2,6-dimethyl-2,6-heptanediol, 2,6-diethyl-2,6-heptanediol, 2,6-di-n-propyl-2,6-heptanediol, 2,6-diphenyl-2,6-heptanediol, 2,7-dimethyl-2,7-octanediol, 2,7-diethyl-2,7-octanediol, 2,7-di-n-propyl-2,7-octanediol, and 2,7-diphenyl-2,7-octanediol; trihydric alcohols such as 2,4-dimethyl-2,4-dihydroxy-3-(2-hydroxypropyl)pentane, 2,4-diethyl-2,4-dihydroxy-3-(2-hydroxypropyl)pentane, 2,5-dimethyl-2,5-dihydroxy-3-(2-hydroxypropyl)hexane, and 2,5-diethyl-2,5-dihydroxy-3-(2-hydroxypropyl)hexane; and tetrahydric alcohols such as 2,4-dimethyl-2,4-dihydroxy-3,3-di(2-hydroxypropyl)pentane, 2,4-diethyl-2,4-dihydroxy-3,3-di(2-hydroxypropyl)pentane, 2,5-dimethyl-2,5-dihydroxy-3,4-di(2-hydroxypropyl)hexane, and 2,5-diethyl-2,4-dihydroxy-3,4-di(2-hydroxypropyl)hexane.

Alternatively, examples of the polyhydric alcohol represented by the formula (11) include 1,4-di(2-hydroxypropyl)benzene, 1,3-di(2-hydroxypropyl)benzene, 1,3,5-tri(2-hydroxypropyl)benzene, and 1,2,4,5-tetra(2-hydroxypropyl)benzene.

Alternatively, examples of the polyhydric alcohol represented by the formula (12) include 2,2-bis{4-(2-hydroxypropyl)phenyl}propane, 1,2,2-tris{4-(2-hydroxypropyl)phenyl}propane, 1,2,3,4-tetra{4-(2-hydroxypropyl)phenyl}butane, bis{4-(2-hydroxypropyl)phenyl}ether, bis{4-(2-hydroxypropyl)phenyl}sulfide, bis{4-(2-hydroxypropyl)phenyl}ketone, and bis{4-(2-hydroxypropyl)phenyl}sulfone.

Of these polyhydric alcohols, the polyhydric alcohol represented by the formula (10) is preferable. More preferably, 2,3-dimethyl-2,3-butanediol, 2,4-dimethyl-2,4-pentanediol, 2,5-dimethyl-2,5-hexanediol, 2,6-dimethyl-2,6-heptanediol, 2,7-dimethyl-2,7-octanediol, or the like, particularly preferably, 2,5-dimethyl-2,5-hexanediol is used.

Moreover, examples of the monovalent carboxylic acid having one polymerizable unsaturated bond, which is used in the synthesis of the polymerizable unsaturated monomer that gives the acid-labile branch unit having the divalent ester group represented by the formula (8), include (meth)acrylic acid, crotonic acid, cinnamic acid, maleic acid, fumaric acid, itaconic acid, 2-(meth)acryloyloxyethylcarboxylic acid, and 4-(meth)acryloyloxycyclohexylcarboxylic acid.

Alternatively, examples of the monohydric alcohol having one polymerizable unsaturated bond, which is used in the synthesis of the polymerizable unsaturated monomer that gives the acid-labile branch unit having the divalent carbonate group represented by the formula (9), include: hydroxystyrenes such as 2-hydroxystyrene, 3-hydroxystyrene, 4-hydroxystyrene, 2-isopropenylphenol, 3-isopropenylphenol, and 4-isopropenylphenol; and hydroxyalkyl(meth)acrylates such as 2-hydroxyethyl(meth)acrylate, 2-hydroxypropyl(meth)acrylate, 3-hydroxypropyl(meth)acrylate, 2-hydroxybutyl(meth)acrylate, 3-hydroxybutyl(meth)acrylate, and 4-hydroxybutyl (meth)acrylate.

In the present invention, the acid-labile branch unit is preferably a unit represented by the following formula (5), and specific examples thereof include a unit obtained by the cleavage of two polymerizable unsaturated bonds in compounds such as 2,5-dimethylhexane-2,5-diacrylate, 2,6-dimethylheptane-2,6-diacrylate, and 2,7-dimethyloctane-2,7-diacrylate:

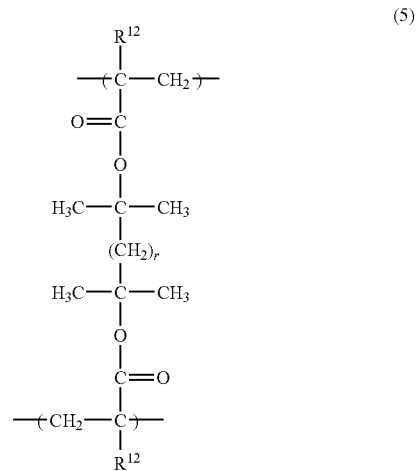

(5)

wherein, in the formula (5), each $R^{12}$ independently represents a hydrogen atom or a methyl group, and r is any integer of 0 to 4.

In the resin (B), these acid-labile branch units can be present alone or in combination of two or more of them.

Specific examples of the rein (B) particularly preferably used in the present invention include 4-hydroxystyrene/4-t-butoxystyrene copolymers, 4-hydroxystyrene/t-butyl(meth)acrylate copolymers, 4-hydroxystyrene/4-t-butoxystyrene/t-butyl(meth)acrylate copolymers, 4-hydroxystyrene/4-t-butoxystyrene/4-(1-ethoxyethoxy)styrene copolymers, 4-hydroxystyrene/4-t-butoxystyrene/styrene copolymers, 4-hydroxystyrene/t-butyl(meth)acrylate/4-(1-ethoxyethoxy)styrene copolymers, 4-hydroxystyrene/t-butyl (meth)acrylate/styrene copolymers, 4-hydroxystyrene/4-t-butoxystyrene/t-butyl(meth)acrylate/4-(1-ethoxyethoxy)styrene copolymers, 4-hydroxystyrene/4-t-butoxystyrene/t-butyl (meth)acrylate/styrene copolymers, 4-hydroxystyrene/4-t-butoxystyrene/2,5-dimethylhexane-2,5-di(meth)acrylate copolymers, and 4-hydroxystyrene/t-butyl (meth)acrylate/2,5-dimethylhexane-2,5-di(meth)acrylate copolymers.

In the resin (B), the content of the recurring unit (2) is preferably 60 to 80% by mol, particularly preferably 65 to 75% by mol. The total content of the recurring units (3) and (4) is preferably 10 to 40% by mol, particularly preferably 10 to 35% by mol. The content of the additional recurring unit is usually 25% by mol or less, preferably 10% by mol or less.

The content of the acid-labile branch unit is usually 10% by mol or less, preferably 5% by mol or less.

In this case, if the content of the recurring unit (2) is less than the given range, the adhesion of a resist pattern to a substrate tends to be reduced. On the other hand, if the content of the recurring unit (2) exceeds the given range, a contrast after development tends to be reduced. Moreover, if the total content of the recurring units (3) and (4) is less than the given range, resolution tends to be reduced. On the other hand, if the total content of the recurring units (3) and (4) exceeds the given range, the adhesion of a resist pattern to a substrate tends to be reduced. Moreover, if the content of the additional recurring unit exceeds the given value, the adhesion of a resist pattern to a substrate tends to be reduced or resolution tends to be reduced. Furthermore, if the content of the acid-labile branch unit exceeds the given value, the solubility of the obtained resin in a solvent tends to be reduced.

The polystyrene-reduced weight molecular weight (hereinafter, referred to as "Mw") of the resin (B) measured by gel permeation chromatography (GPC) is preferably 1,000 to 150,000, more preferably 3,000 to 100,000.

Moreover, the ratio (Mw/Mn) of the Mw to the polystyrene-reduced number molecular weight (hereinafter, referred to as "Mn") of the resin (B) measured by gel permeation chromatography (GPC) is usually 1 to 10, preferably 1 to 5.

In the present invention, these resins (B) can be used alone or as a mixture of two or more of them.

Additive

It is preferred that the radiation-sensitive resin composition of the present invention should further contain an acid diffusion controller having the effect of controlling the diffusion phenomenon of an acid generated from the acid generator (A) upon exposure in a resist film such that undesired chemical reactions in the unexposed area is suppressed.

The use of such an acid diffusion controller further improves the storage stability of the composition and also improves resolution as a resist. In addition, the use of such an acid diffusion controller prevents the line width of the resist pattern from varying due to fluctuations in post-exposure delay (PED) from exposure to heat treatment after exposure, leading to excellent process stability.

The acid diffusion controller is preferably a nitrogen-containing organic compound that does not vary in its basicity depending on exposure or heat treatment during a resist pattern formation step.

Examples of such a nitrogen-containing organic compound include: a compound represented by the following formula (13) (hereinafter, referred to as a "nitrogen-containing compound (i)"):

(13)

wherein, in the formula (13), each $R^{20}$ independently represents a hydrogen atom, an alkyl group, an aryl group, or an aralkyl group, and each of these alkyl, aryl, and aralkyl groups may be substituted;
a diamino compound having two nitrogen atoms in one molecule (hereinafter, referred to as a "nitrogen-containing compound (II)"); a diamino polymer having three or more nitrogen atoms in one molecule (hereinafter, referred to as a "nitrogen-containing compound (iii)"); and an amide group-containing compound, a urea compound, a nitrogen-containing heterocyclic compound, and an N,N-dimethylacrylamide (co)polymer.

Examples of the nitrogen-containing compound (I) include: linear, branched, or cyclic monoalkylamines such as n-hexylamine, n-heptylamine, n-octylamine, n-nonylamine, n-decylamine, and cyclohexylamine; linear, branched, or cyclic dialkylamines such as di-n-butylamine, di-n-pentylamine, di-n-hexylamine, di-n-heptylamine, di-n-octylamine, di-n-nonylamine, di-n-decylamine, methyl cyclohexylamine, and dicyclohexylamine; linear, branched, or cyclic trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; linear, branched, or cyclic alkanolamines such as ethanolamine, diethanolamine, and triethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine.

Examples of the nitrogen-containing compound (II) include ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene.

Examples of the nitrogen-containing compound (iii) include polyethylenimine, polyallylamine, and an N-(2-dimethylaminoethyl)acrylamide (co) polymer.

Examples of the amide group-containing compound include formamide, N-methylformamide, N,N-dimethylformamide, acetamide, N-methylacetamide, N,N-dimethylacetamide, propionamide, benzamide, pyrrolidone, and N-methylpyrrolidone.

Examples of the urea compound include urea, methylurea, 1,1-dimethylurea, 1,3-dimethylurea, 1,1,3,3-tetramethylurea, 1,3-diphenylurea, and tributylthiourea.

Examples of the nitrogen-containing heterocyclic compound include: imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 8-oxyquinoline, and acridine; and pyrazine, pyrazole, pyridazine, quinoxaline, purine, pyrrolidine, piperidine, morpholine, 4-methylmorpholine, piperazine, 1,4-dimethylpiperazine, and 1,4-diazabicyclo[2.2.2]octane.

Examples of the N,N-dimethylacrylamide (co)polymer include 4-hydroxystyrene/4-t-butoxystyrene/N,N-dimethylacrylamide copolymers and 4-hydroxystyrene/4-t-butoxystyrene/styrene/N,N-dimethylacrylamide copolymers.

Moreover, a base precursor having an acid-labile group, for example, N-(t-butoxycarbonyl)piperidine, N-(t-butoxycarbonyl)imidazole, N-(t-butoxycarbonyl)benzimidazole, N-(t-butoxycarbonyl)-2-phenylbenzimidazole, N-(t-butoxycarbonyl)di-n-octylamine, N-(t-butoxycarbonyl)diethanolamine, N-(t-butoxycarbonyl)dicyclohexylamine, or N-(t-butoxycarbonyl)diphenylamine, can be used as the nitrogen-containing organic compound acting as an acid diffusion controller.

Of these nitrogen-containing organic compounds, the nitrogen-containing compound (i), the nitrogen-containing heterocyclic compound, the N,N-dimethylacrylamide (co) polymer, the base precursor having an acid-labile group, or the like is preferable.

These acid diffusion controllers can be used alone or as a mixture of two or more of them.

The amount of the acid diffusion controller used is usually 15 parts by weight or less, preferably 0.001 to 10 parts by weight, particularly preferably 0.005 to 5 parts by weight, with respect to 100 parts by weight of the acid-labile group-containing resin or alkali-soluble resin. In this case, if the amount of the acid diffusion controller used exceeds the given value, sensitivity as a resist or the developability of an exposed area tends to be reduced. If the amount of the acid diffusion controller used is less than 0.001 parts by weight, the pattern profile or dimensional fidelity of a resist pattern may be reduced under some process conditions.

The radiation-sensitive resin composition of the present invention can also be supplemented with a carboxyl group-containing anthracene derivative.

Specific examples of the carboxyl group-containing anthracene derivative include anthracene-9-carboxylic acid, anthracene-9,10-dicarboxylic acid, 10-carboxymethylanthracene-9-carboxylic acid, 10-methoxycarbonylanthracene-9-carboxylic acid, 10-t-butoxycarbonylanthracene-9-carboxylic acid, 10-methoxycarbonylmethylanthracene-9-carboxylic acid, and 10-t-butoxycarbonylmethylanthracene-9-carboxylic acid.

These carboxyl group-containing anthracene derivatives can be used alone or as a mixture of two or more of them.

The amount of the carboxyl group-containing anthracene derivative used is usually 40 parts by weight or less, more preferably 20 parts by weight or less, particularly preferably 10 parts by weight or less, with respect to 100 parts by weight of the acid-labile group-containing resin or alkali-soluble resin. In this case, if the amount of the carboxyl group-containing anthracene derivative used exceeds the given amount, sensitivity tends to be reduced.

Moreover, the radiation-sensitive resin composition of the present invention can be supplemented with a dye (hereinafter, referred to as an "additional dye") other than the carboxyl group-containing anthracene derivative.

The additional dye is preferably any of those having high far ultraviolet absorptivity. Examples thereof include:
other anthracene derivatives such as methoxycarbonylmethyl anthracene-9-carboxylate, t-butoxycarbonylmethyl anthracene-9-carboxylate, 9-methoxycarbonylmethylanthracene, and 9-t-butoxycarbonylmethylanthracene;
carbazole derivatives such as 9 carbazole acetic acid, N-(methoxycarbonylmethyl)carbazole, and N-(t-butoxycarbonylmethyl)carbazole; and
benzophenone derivatives such as benzophenone-2-carboxylic acid, benzophenone-4-carboxylic acid, t-butoxycarbonylmethyl benzophenone-2-carboxylate, and t-butoxycarbonylmethyl benzophenone-4-carboxylate.

These additional dyes can be used alone or as a mixture of two or more of them.

The proportion of the additional dye used is usually 20% by weight or less, preferably 10% by weight or less, with respect to the total amount of the carboxyl group-containing anthracene derivative and the additional dye.

Moreover, the radiation-sensitive resin composition of the present invention can be supplemented with a surfactant that exhibits the effect of improving the applicability, striation, resist developability, and so on of the composition.

Examples of such a surfactant include polyoxyethylene lauryl ether, polyoxyethylene stearyl ether, polyoxyethylene oleyl ether, polyoxyethylene n-octylphenol ether, polyoxyethylene n-nonylphenol ether, polyethylene glycol dilaurate, and polyethylene glycol distearate and include commercially available products such as trade names EFTOP EF301, EF303, and EF352 (manufactured by TOHKEM PRODUCTS CORPORATION), MEGAFAC F171 and F173 (manufactured by Dainippon Ink and Chemicals, Inc.), Fluorad FC430 and FC431 (manufactured by Sumitomo 3M, Ltd.), Asahi Guard AG710, Surflon S-382, SC101, SC102, SC103, SC104, SC105, and SC106 (manufactured by Asahi Glass Co., Ltd.), KP341 (manufactured by Shin-Etsu Chemical Co., Ltd.), and Polyflow No. 75 and No. 95 (manufactured by Kyoeisha Chemical Co., Ltd.).

These surfactants can be used alone or as a mixture of two or more of them.

The amount of the surfactant used is usually 2 parts by weight or less with respect to 100 parts by weight of the acid-labile group-containing resin or alkali-soluble resin.

Moreover, the radiation-sensitive resin composition of the present invention can be supplemented with, for example, one or more rose bengals, in addition to the anthracene derivative (A) and the additional dye.

The amount of the rose bengal or the like used is usually 50 parts by weight or less with respect to 100 parts by weight of the acid-labile group-containing resin or alkali-soluble resin.

Moreover, the addition of a dye and/or a pigment other than those described above can visualize the latent image of an exposed area and mitigate the influence of halation upon exposure. The addition of an adhesion aid can improve adhesion to a substrate.

Furthermore, an anti-halation agent such as 4-hydroxy-4'-methylchalcone, a form improver, a storage stabilizer, an antifoaming agent, and the like can also be added thereto.

Composition Solution

The radiation-sensitive resin composition of the present invention, when used, is usually prepared in the form of a composition solution by uniformly dissolving the components in a solvent such that the total solid content usually falls within the range of 0.1 to 50% by weight, preferably 1 to 40% by weight, and then filtering the resulting composition through a filter of approximately 0.2 µm in pore size.

Examples of the solvent used in the preparation of the composition solution include:
ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; lactic acid esters such as methyl lactate, ethyl lactate, n-propyl lactate, and i-propyl lactate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxybutyl acetate, 3-methyl-3-methoxybutyl acetate, 3-methyl-3-methoxybutyl propionate, 3-methyl-3-methoxybutyl butyrate, methyl acetoacetate, ethyl acetoacetate, methyl pyruvate, and ethyl pyruvate; aromatic hydrocarbons such as toluene and xylene; ketones such as methyl ethyl ketone, 2-pentanone, 2-hexanone, 2-heptanone, 3-heptanone, 4-heptanone, and cyclohexane; amides such as N-methylformamide, N,N-dimethylformamide, N-methylacetamide, N,N-dimethylacetamide, and N-methylpyrrolidone; and lactones such as γ-butyrolactone.

These solvents can be used alone or as a mixture of two or more of them.

Formation of Resist Pattern

To form a resist pattern from the radiation-sensitive resin composition of the present invention, the composition solution thus prepared is applied onto a substrate, for example, a silicon wafer or aluminum-coated wafer, by appropriate coating means such as rotational coating, cast coating, or roll coating to form a resist film. The resist film is exposed via a prescribed mask pattern after optional heat treatment or prebaking (hereinafter, referred to as "PB") at a temperature of approximately 70° C. to 160° C. in advance.

For example, extreme or far ultraviolet rays such as a KrF excimer laser (wavelength: 248 nm), an ArF excimer laser (wavelength: 193 nm), an $F_2$ excimer laser (wavelength: 157 nm), and EUV (wavelength: 13 nm etc.), or charged particle beams such as electron beams are preferable as radiations used in exposure. Depending on, for example, the type of the additional acid generator, X-rays such as synchrotron radiations or usual ultraviolet rays such as i-rays (wavelength: 365 nm) can also be used.

Moreover, exposure conditions such as an exposure dose are appropriately selected according to the formulated composition of the radiation-sensitive resin composition, the type of each additive, and so on.

In the present invention, it is preferred for stably forming a highly precise, fine resist pattern that heat treatment or post-exposure bake (hereinafter, referred to as "PEB") at a temperature of 70 to 160° C. for 30 seconds or longer should be performed after exposure. In this case, if the PEB temperature is lower than 70° C., sensitivity may vary more largely depending on the type of the substrate.

Then, a prescribed resist pattern is formed by development using an alkaline developing solution under conditions involving usually 10 to 50° C. for 10 to 200 seconds, preferably 15 to 30° C. for 15 to 100 seconds, particularly preferably 20 to 25° C. for 15 to 90 seconds.

For example, an alkaline aqueous solution containing an alkaline compound such as alkali metal hydroxides, ammonia water, mono-, di-, or tri-alkylamines, mono-, di-, or tri-alkanolamines, heterocyclic amines, tetraalkylammonium hydroxides, choline, 1,8-diazabicyclo-[5.4.0]-7-undecene, or 1,5-diazabicyclo-[4.3.0]-5-nonene dissolved at a concentration of usually 1 to 10% by weight, preferably 1 to 5% by weight, particularly preferably 1 to 3% by weight, is used as the alkaline developing solution.

For example, an appropriate amount of a water-soluble organic solvent such as methanol or ethanol, or a surfactant may also be added to the alkaline aqueous solution.

In the formation of such a resist pattern, a protective film can be provided on the resist film to prevent the influence of basic impurities or the like contained in an environment or atmosphere.

DESCRIPTION OF THE PREFERRED EMBODIMENTS

Figure 1:
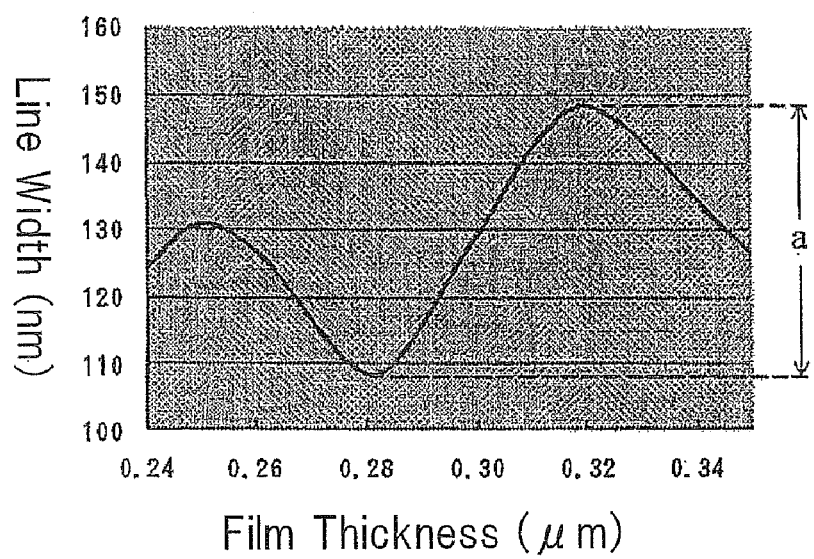
FIG. 1 is a graph showing one example of results of measuring the value of fluctuations in line width attributed to standing waves.

Hereinafter, the present invention will be described more specifically with reference to Examples. However, the present invention is not intended to be limited to these Examples by any means.

Synthesis Example 1

101 g of 4-acetoxystyrene, 42 g of 4-t-butoxystyrene, 5 g of styrene, 6 g of azobisisobutyronitrile (AIBN), and 1 g of t-dodecylmercaptan were dissolved in 160 g of propylene glycol monomethyl ether, followed by polymerization at a reaction temperature kept at 70° C. for 16 hours in a nitrogen atmosphere. After polymerization, the reaction solution was added dropwise into a large amount of n-hexane, and the produced resin was solidified and purified.

Subsequently, to this purified resin, 150 g of propylene glycol monomethyl ether was added again, and 300 g of methanol, 80 g of triethylamine, and 15 g of water were further added. While the mixture was refluxed at a boiling point, a hydrolysis reaction was performed for 8 hours. After reaction, the solvents and triethylamine were distilled off under reduced pressure. The obtained resin was dissolved in acetone. Then, this solution was added dropwise into a large amount of water and solidified. The produced white powder was filtered and dried overnight at 50° C. under reduced pressure.

The obtained resin had Mw=16,000 and Mw/Mn=1.7, and had a 4-hydroxystyrene/4-t-butoxystyrene/styrene copolymerization ratio of 72:23:5 by mol as a result of $^{13}$C-NMR analysis. This resin is designated as a "resin (B-1)".

The Mw and Mw/Mn of the resin (B-1) and each of resins obtained in Synthesis Examples 2 to 4 below were measured by gel permeation chromatography (GPC) using GPC columns (two G2000HXL columns, one G3000HXL column, and one G4000HXL column) manufactured by TOSOH CORP. and using monodisperse polystyrene as a standard under analysis conditions involving a flow rate of 1.0 ml/min., use of tetrahydrofuran as an elution solvent, and a column temperature of 40° C.

Synthesis Example 2

100 g of 4-acetoxystyrene, 25 g of t-butyl acrylate, 18 g of styrene, 6 g of AIBN, and 1 g of t-dodecylmercaptan were dissolved in 230 g of propylene glycol monomethyl ether, followed by polymerization at a reaction temperature kept at 70° C. for 16 hours in a nitrogen atmosphere. After polymerization, the reaction solution was added dropwise into a large amount of n-hexane, and the produced resin was solidified and purified.

Subsequently, to this purified resin, 150 g of propylene glycol monomethyl ether was added again, and 300 g of methanol, 80 g of triethylamine, and 15 g of water were further added. While the mixture was refluxed at a boiling point, a hydrolysis reaction was performed for 8 hours. After reaction, the solvents and triethylamine were distilled off under reduced pressure. The obtained resin was dissolved in acetone. Then, this solution was added dropwise into a large amount of water and solidified. The produced white powder was filtered and dried overnight at 50° C. under reduced pressure.

The obtained resin had Mw=11,500 and Mw/Mn=1.6 and had a 4-hydroxystyrene/t-butyl acrylate/styrene copolymerization ratio of 61:19:20 by mol as a result of $^{13}$C-NMR analysis. This resin is designated as a "resin (B-2)".

Synthesis Example 3

173 g of 4-acetoxystyrene, 56 g of 4-t-butoxystyrene, 11 g of 2,5-dimethylhexane-2,5-diacrylate, 14 g of AIBN, and 11 g of t-dodecylmercaptan were dissolved in 240 g of propylene glycol monomethyl ether, followed by polymerization at a reaction temperature kept at 70° C. for 16 hours in a nitrogen atmosphere. After polymerization, the reaction solution was added dropwise into a large amount of n-hexane, and the produced resin was solidified and purified, followed by drying at 50° C. for 3 hours under reduced pressure. Subsequently, to 190 g of this purified resin, 150 g of propylene glycol monomethyl ether was added again, and 300 g of methanol, 100 g of triethylamine, and 15 g of water were further added. While the mixture was refluxed at a boiling point, a hydrolysis reaction was performed for 8 hours. After reaction, the solvents and triethylamine were distilled off under reduced pressure. The obtained resin was dissolved in acetone. Then, this solution was added dropwise into a large amount of water and solidified. The produced white powder was filtered and dried overnight at 50° C. under reduced pressure.

The obtained resin had Mw=27,000 and Mw/Mn=2.6 and had a 4-hydroxystyrene/4-t-butoxystyrene/2,5-dimethylhexane-2,5-diacrylate copolymerization ratio of 75:22:3 by mol as a result of $^{13}$C-NMR analysis. This resin is designated as a "resin (B-3)".

Synthesis Example 4

A solvent used here was used after reflux for 6 hours in the presence of sodium metal, followed by distillation in a nitrogen atmosphere. Moreover, each monomer was used after bubbling for 1 hour using dried nitrogen gas, followed by distillation in a nitrogen atmosphere.

A solution containing 37.6 g of 4-(1-ethoxyethoxy)styrene, 11.0 g of 4-t-butoxystyrene, and 1.4 g of styrene dissolved in 200 g of cyclohexane was placed in a dry vial resistant to pressure, and the vial was sealed with a crown cap having a hole and a Neoprene (trade name; manufactured by DuPont) gasket. Then, this pressure-resistant vial was cooled to −20° C. Then, 2.96 ml of a solution containing n-butyl lithium dissolved in cyclohexane at a concentration of 1.83 mol/l, and 0.98 g of N,N,N',N'-tetramethylethylenediamine were added thereto in this order. A reaction was performed at a temperature kept at −20° C. for 1 hour. Then, the reaction was terminated by the injection of 1.0 g of methanol. In this procedure, the solution turned colorless from a red color. As a result, the termination of the reaction was confirmed.

Subsequently, the reaction solution was washed with 200 g of 3% by weight of oxalic acid water. Then, 200 g of propylene glycol monomethyl ether and 1.5 g of p-toluenesulfonic acid were added thereto. A hydrolysis reaction was performed by stirring at room temperature (23 to 25° C.) for 3 hours. Then, the reaction solution was added dropwise into a large amount of water and solidified to produce a resin. The produced white powder was filtered and dried overnight at 50° C. under reduced pressure.

The obtained resin had Mw=16,000 and Mw/Mn=1.3 and had a 4-hydroxystyrene/4-t-butoxystyrene/styrene copolymerization ratio of 72:23:5 by mol as a result of $^{13}$C-NMR analysis. This resin is designated as a "resin (B-4)".

In this context, each resist was evaluated by the following procedures:

Sensitivity:

A resist film formed on a silicon wafer was exposed at varying exposure doses, and immediately thereafter, the wafer was subjected to PEB and subsequently to alkaline development and then washed with water, followed by drying to form a resist pattern. In this process, an exposure dose that forms a line-and-space (1:1) pattern (1L1S) with a line width of 130 nm is defined as the optimum exposure dose, and this optimum exposure dose was assessed as sensitivity.

Resolution:

The minimum dimension of lines in a line-and-space pattern (1L1S) resolved upon exposure at the optimum exposure dose is defined as resolution.

Value of Fluctuations in Line Width Attributed to Standing Waves:

The thickness of a resist film formed on a silicon wafer was changed within the range from 0.2 to 0.4 μm in increments of 0.01 μm, and the line width of a line-and-space pattern (1L1S) with a designed line width of 130 nm was measured at the optimum exposure dose at a film thickness of 0.3 μm using a CD (Critical Dimension)-scanning electron microscope S-9220 (trade name; manufactured by Hitachi High-Technologies Corp.). A graph on which one example of the measurement results is plotted is shown in FIG. 1. In this process, a difference between the maximum and minimum values of the line width of the pattern at a film thickness ranging from 0.24 to 0.35 μm is defined as the "value of fluctuations in line width attributed to standing waves".

Degree of Deterioration in Shape Attributed to Standing Waves

Figure 2:
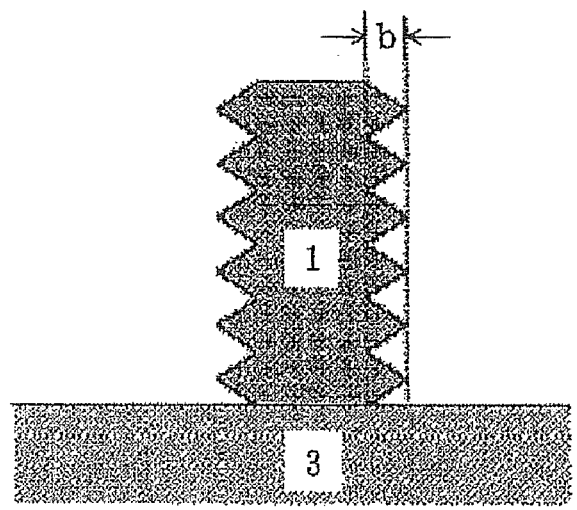
FIG. 2 is a schematic diagram of a longitudinal section of a line for describing procedures of evaluating the degree of deterioration in pattern profile attributed to standing waves.

The cross section of lines in a line-and-space pattern (1L1S) with a line width of 130 nm was observed at the optimum exposure dose using a scanning electron microscope S-4200 (trade name; manufactured by Hitachi High-Technologies Corp.) to measure the width of a rough area in the line. A schematic diagram of a longitudinal section of the line is shown in FIG. 2 (note that roughness is more exaggerated than actual one). In FIG. 2, reference numeral 1 denotes a line, and reference numeral 3 denotes a substrate. In this process, a width b of roughness on the side of the line is defined as the "degree of deterioration in shape attributed to standing waves".

Figure 3:
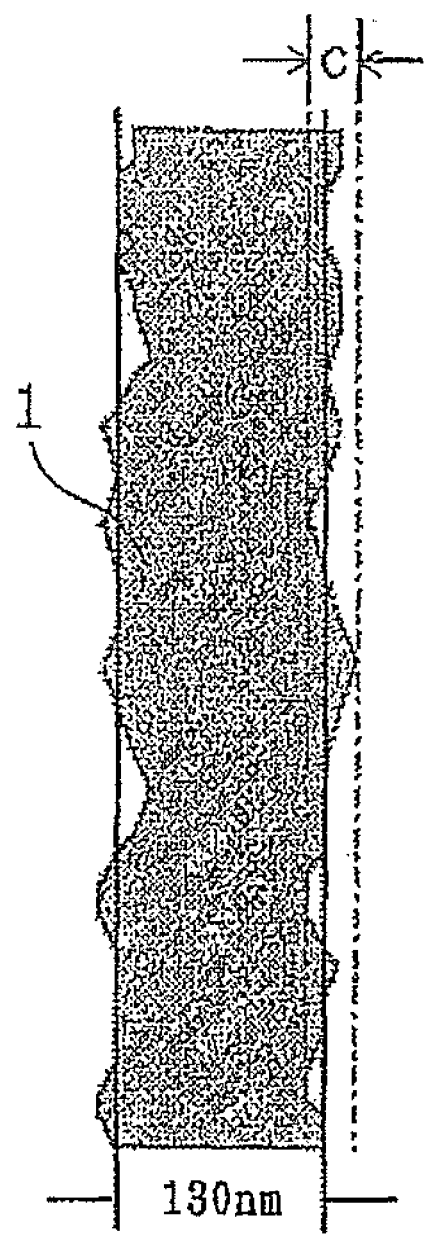
FIG. 3 is a schematic diagram of a longitudinal section of a line for describing procedures of evaluating nano edge roughness.

Nano Edge Roughness:

A line-and-space pattern (1L1S) with a line width of 130 nm was observed at the optimum exposure dose using a CD-scanning electron microscope S-9220 (trade name; manufactured by Hitachi High-Technologies Corp.). A schematic diagram of a longitudinal section of the line is shown in FIG. 3 (note that roughness is more exaggerated than actual one). In FIG. 3, reference numeral 1 denotes a line. In this process, the maximum width c of roughness occurring along the side of the line is defined as "nano edge roughness".

Figure 4:
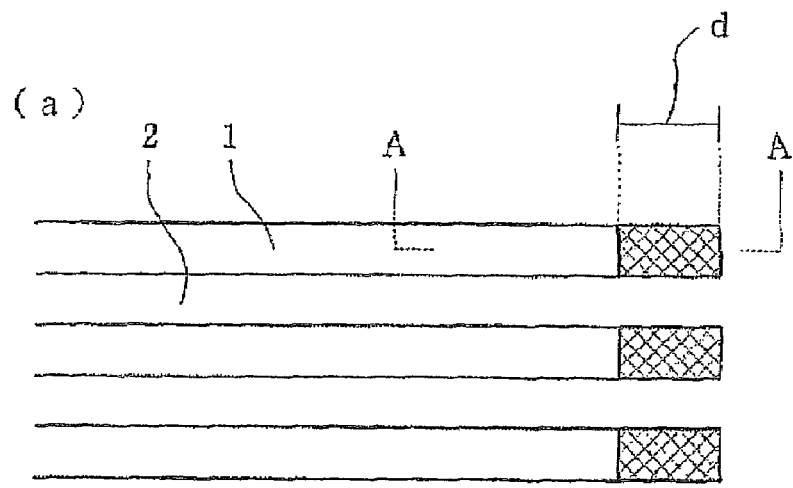
FIG. 4 is a schematic plan diagram of a pattern for describing procedures of evaluating LEF.
Figure 4:
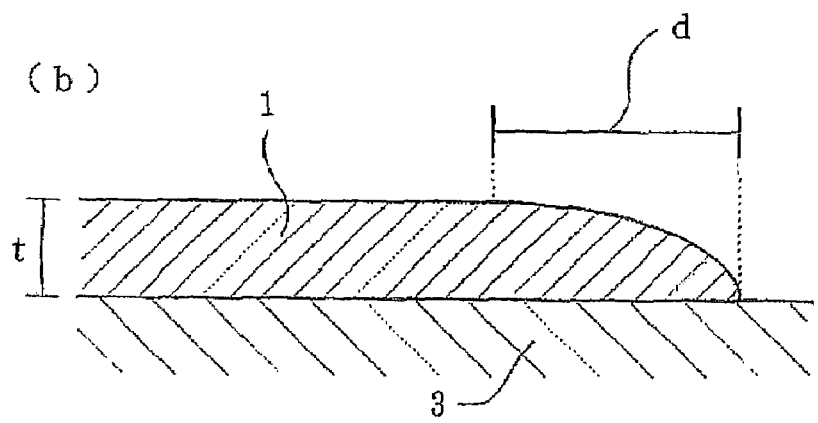
Figure 5:
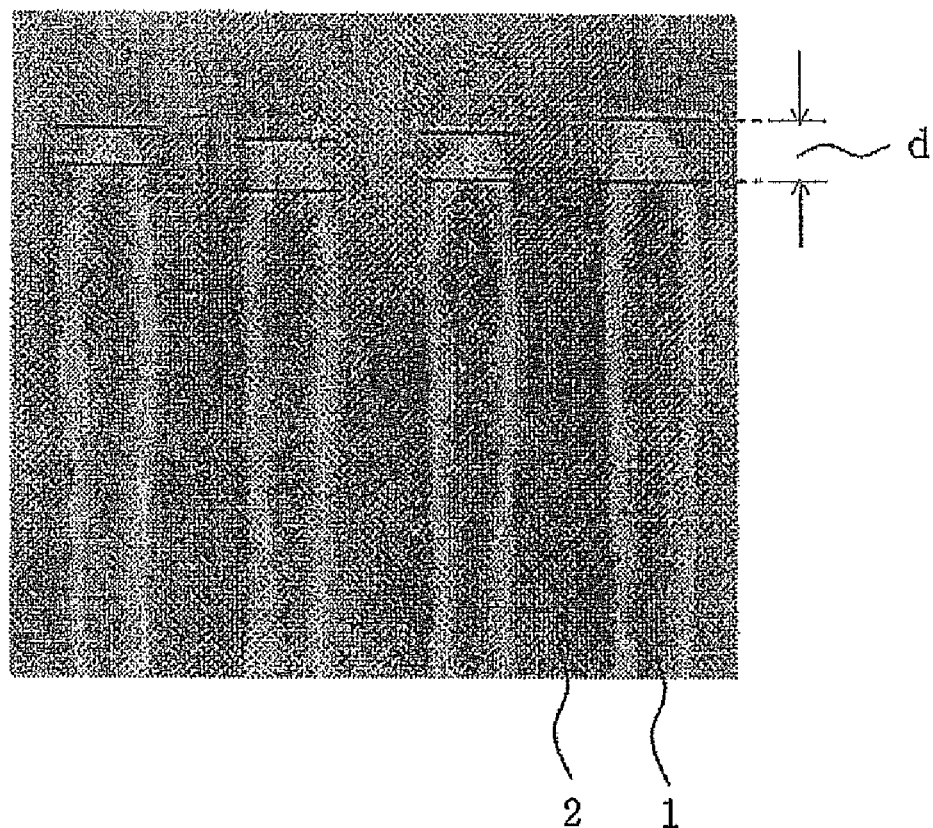
FIG. 5 is a diagram showing one example of results of observing the plane of a pattern for describing procedures of evaluating LEF.

LEF:

A line-and-space pattern (1L1S) with a line width of 130 nm was observed at the optimum exposure dose using a CD-scanning electron microscope S-9220 (trade name; manufactured by Hitachi High-Technologies Corp.). A schematic plan diagram of the pattern is shown in FIG. 4, and one example of the observation results is shown in FIG. 5. FIG. 4(a) is a schematic plan diagram of the pattern, and FIG. 4(b) is a fragmentary sectional view of a longitudinal section of the line taken along line A-A in FIG. 4(a). Reference numeral 1 denotes a line in the pattern, reference character t denotes a film thickness, reference numeral 2 denotes a space in the pattern, and reference numeral 3 denotes a substrate. An edge d having a thinner film thickness in FIG. 4(b) corresponds to an edge d in FIG. 5 that looks white. In this process, the dimension of the edge d in each line was measured, and an average value determined from 15 lines in the central part out of 25 lines in total is defined as "LEF".

Examples 1 to 13 and Comparative Examples 1 to 2

Components shown in Table 1 (note that a part refers to a part by weight) were mixed to prepare a uniform solution. Then, the solution was filtered thorough a Teflon (registered trademark) membrane filter of 0.2 μm in pore size to prepare a composition solution.

Subsequently, each composition solution was applied onto a silicon wafer by rotational coating. Then, the silicon wafer was subjected to PB using a temperature and time shown in Table 2 to form a resist film of 0.3 μm in film thickness. Then, each resist film was exposed to a KrF excimer laser (wavelength: 248 nm) at varying exposure doses via a mask pattern using a KrF Excimer laser exposure apparatus NSR-S203B (trade name; manufactured by Nikon Corp.). Then, the wafer was subjected to PEB using a temperature and time shown in Table 2. Then, the wafer was subjected to development at 23° C. for 60 seconds using 2.38% by weight of an aqueous tetramethylammonium hydroxide solution as a developing solution and then washed with water for 30 seconds, followed by drying to form a resist pattern.

Evaluation results of each Example and Comparative Example are shown in Table 3.

In Table 1, each component other than the resin (B) is as follows:

Acid Generator (A)
A-1: 2,4,6-trimethylphenyldiphenylsulfonium 2,4-difluorobenzenesulfonate
A-2: 2,4,6-trimethylphenyldiphenylsulfonium 4-trifluoromethylbenzenesulfonate
A-3: N-(trifluoromethanesulfonyloxy)bicyclo[2.2.1]hept-5-ene-2,3-dicarboximide
A-4: N-((5-methyl-5-carboxymethylbicyclo[2.2.1]heptane-2-yl)sulfonyloxy)succinimide
A-5: N-(nonafluoro-n-butanesulfonyloxy)bicyclo[2.2.1]hept-5-ene-2,3-dicarboximide
A-6: triphenylsulfonium benzenesulfonate
A-7: bis(4-t-butylphenyl)iodonium 10-camphorsulfonate
Acid Diffusion Controller
C-1: 2-phenylbenzimidazole
Additive
D-1: 9-anthracenecarboxylic acid
Solvent
S-1: ethyl lactate
S-2: propylene glycol monomethyl ether acetate

TABLE 1

| | Acid generator (A) (part) | | | Acid | | |
|---|---|---|---|---|---|---|
| | Acid generator (1) | Additional acid generator | Resin (B) (part) | diffusion controller (part) | Additional additive (part) | Solvent (part) |
| Example 1 | A-1(0.5) | A-3(9.0) | B-1(100) | C-1(0.5) | — | S-1(630) S-2(270) |
| Example 2 | A-1(0.5) | A-3(3.0) | B-1(100) | C-1(0.5) | — | S-1(630) S-2(270) |
| Example 3 | A-1(0.5) | A-3(12.0) | B-1(100) | C-1(0.5) | — | S-1(630) S-2(270) |
| Example 4 | A-1(4.0) | A-3(9.0) | B-1(100) | C-1(0.5) | — | S-1(630) S-2(270) |
| Example 5 | A-2(1.0) | A-3(9.0) | B-1(100) | C-1(0.5) | — | S-1(630) S-2(270) |
| Example 6 | A-1(0.5) | A-3(9.0) A-7(1.0) | B-1(100) | C-1(0.5) | — | S-1(630) S-2(270) |
| Example 7 | A-1(0.5) | A-3(9.0) | B-1(100) | C-1(0.5) | D-1(7.0) | S-1(630) S-2(270) |
| Example 8 | A-1(0.5) | A-3(3.0) A-4(6.0) | B-1(100) | C-1(0.5) | D-1(7.0) | S-1(630) S-2(270) |
| Example 9 | A-1(0.5) | A-5(9.0) | B-1(100) | C-1(0.5) | — | S-1(630) S-2(270) |
| Example 10 | A-1(0.5) | A-3(9.0) | B-2(100) | C-1(0.5) | — | S-1(630) S-2(270) |
| Example 11 | A-1(0.5) | A-3(9.0) | B-3(100) | C-1(0.5) | — | S-1(630) S-2(270) |
| Example 12 | A-1(0.5) | A-3(9.0) | B-3(100) | C-1(0.5) | D-1(7.0) | S-1(630) S-2(270) |
| Example 13 | A-1(0.5) | A-3(9.0) | B-4(100) | C-1(0.5) | — | S-1(630) S-2(270) |
| Comparative Example 1 | — | A-3(9.0) | B-1(100) | C-1(0.5) | — | S-1(630) S-2(270) |
| Comparative Example 2 | — | A-3(9.0) A-6(0.1) | B-1(100) | C-1(0.5) | — | S-1(630) S-2(270) |

TABLE 2

| | PB | | PEB | |
|---|---|---|---|---|
| | Temperature (°C.) | Time (second) | Temperature (°C.) | Time (second) |
| Example 1 | 130 | 90 | 130 | 90 |
| Example 2 | 130 | 90 | 130 | 90 |
| Example 3 | 130 | 90 | 130 | 90 |
| Example 4 | 130 | 90 | 130 | 90 |
| Example 5 | 130 | 90 | 130 | 90 |
| Example 6 | 100 | 90 | 100 | 90 |
| Example 7 | 130 | 90 | 130 | 90 |
| Example 8 | 130 | 90 | 130 | 90 |
| Example 9 | 130 | 90 | 130 | 90 |
| Example 10 | 130 | 90 | 130 | 90 |
| Example 11 | 130 | 90 | 130 | 90 |
| Example 12 | 130 | 90 | 130 | 90 |
| Example 13 | 130 | 90 | 130 | 90 |
| Comparative Example 1 | 130 | 90 | 130 | 90 |
| Comparative Example 2 | 130 | 90 | 130 | 90 |

TABLE 3

| | Sensitivity (J/m²) | Resolution (nm) | Value of fluctuations in line width attributed to standing waves (nm) | Degree of deterioration in shape attributed to standing waves (nm) | Nano edge roughness (nm) | LEF (nm) |
|---|---|---|---|---|---|---|
| Example 1 | 340 | 120 | 37 | 4 | 4 | 7 |
| Example 2 | 440 | 120 | 40 | 7 | 6 | 9 |
| Example 3 | 270 | 120 | 36 | 3 | 3 | 7 |
| Example 4 | 310 | 120 | 31 | 3 | 3 | 6 |
| Example 5 | 350 | 120 | 39 | 4 | 5 | 8 |
| Example 6 | 380 | 120 | 40 | 7 | 7 | 16 |
| Example 7 | 370 | 120 | 24 | 7 | 4 | 13 |
| Example 8 | 380 | 120 | 22 | 7 | 4 | 12 |
| Example 9 | 400 | 120 | 39 | 5 | 6 | 9 |
| Example 10 | 410 | 120 | 39 | 6 | 6 | 11 |
| Example 11 | 380 | 120 | 40 | 6 | 6 | 8 |
| Example 12 | 370 | 120 | 25 | 4 | 6 | 11 |
| Example 13 | 340 | 120 | 40 | 5 | 3 | 11 |
| Comparative Example 1 | 380 | 120 | 55 | 11 | 10 | 25 |
| Comparative Example 2 | 360 | 120 | 49 | 10 | 8 | 22 |

INDUSTRIAL APPLICABILITY

A radiation-sensitive resin composition of the present invention is excellent in resolution, pattern profile, density dependence, environmental tolerance, and so on. In addition, the radiation-sensitive resin composition of the present invention particularly effectively suppresses fluctuations in line width and deterioration in pattern profile attributed to standing waves based on reflection from a substrate and is also improved in nano edge roughness and LEF. Thus, the radiation-sensitive resin composition of the present invention is exceedingly useful as a chemically amplified resist or the like for the production of integrated circuit devices, which will presumably pursue increasingly finer patterns.

The invention claimed is:

1. A radiation-sensitive resin composition comprising: (A) a radiation-sensitive acid generator comprising: a compound having a structure represented by the following formula (1-a) and a structure represented by the following formula (1-b); and a sulfonimide compound,

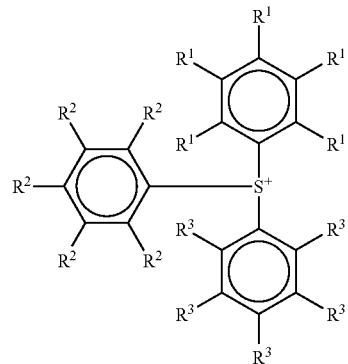

(1-a)

-continued

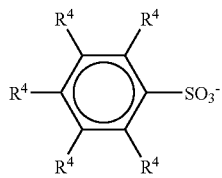

(1-b)

wherein, in the formula (1-a), each $R^1$, each $R^2$, and each $R^3$ independently represent a hydrogen atom, a hydroxyl group, a linear, branched, or cyclic alkyl group having 1 to 10 carbon atoms, a linear, branched, or cyclic alkoxyl group having 1 to 10 carbon atoms, or a t-butoxycarbonylmethoxy group, and satisfy at least one of a condition under which two or more of the $R^1$ moieties are respectively a group other than a hydrogen atom, a condition under which two or more of the $R^2$ moieties are respectively a group other than a hydrogen atom, and a condition under which two or more of the $R^3$ moieties are respectively a group other than a hydrogen atom, and wherein, in the formula (I-b), each $R^4$ independently represents a hydrogen atom, a fluorine atom, or a trifluoromethyl group, and one or more of the $R^4$ moieties are respectively a fluorine atom or a trifluoromethyl group; and (B) a resin having a recurring unit represented by the following formula (2), and at least one of a recurring unit represented by the following formula (3) and a recurring unit represented by the following formula (4):

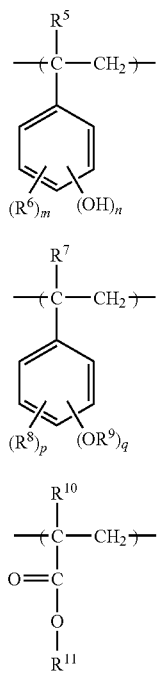

(2)

(3)

(4)

wherein, in the formula (2), $R^5$ represents a hydrogen atom or a methyl group, $R^6$ represents a monovalent organic group except for a t-butoxy group and —O—Z (Z is a monovalent acid-labile group other than a t-butyl group), m is any integer of 0 to 3, n is any integer of 1 to 3, and a plurality of the $R^6$ moieties may be the same as or different from each other, wherein, in the formula (3), $R^7$ represents a hydrogen atom or a methyl group, $R^8$ represents a monovalent organic group except for a t-butoxy group and —O—Z (Z is a monovalent acid-labile group other than a t-butyl group), $R^9$ represents a t-butyl group, p is any integer of 0 to 3, q is any integer of 1 to 3, and a plurality of the $R^8$ moieties may be the same as or different from each other, and wherein, in the formula (4), $R^{10}$ represents a hydrogen atom or a methyl group, and $R^{11}$ represents a t-butyl group, and wherein said composition excludes a resin that does not fall within the definition of resin B.

2. The radiation-sensitive resin composition according to claim 1, wherein the resin as the component (B) is a resin further having a branch unit in which two or more structural units formed by the cleavage of a polymerizable unsaturated bond are bound via an acid-labile linking group.

3. The radiation-sensitive resin composition according to claim 2, wherein the branch unit in which two structural units formed by the cleavage of a polymerizable unsaturated bond are bound via an acid-labile linking group in the resin as the component (B) is a unit represented by the following formula (5):

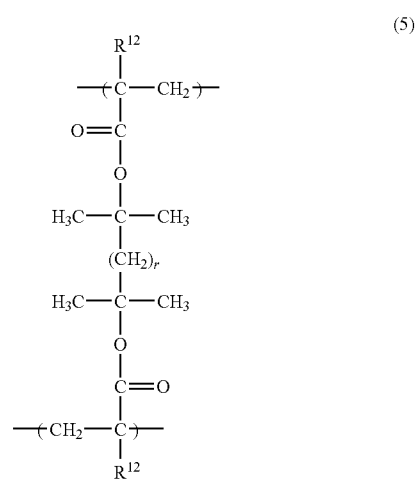

(5)

wherein, in the formula (5), each $R^{12}$ independently represents a hydrogen atom or a methyl group, and r is any integer of 0 to 4.

4. The radiation-sensitive resin composition according to claim 1, characterized in that the sulfonimide compound in the component (A) is represented by the following formula (6):

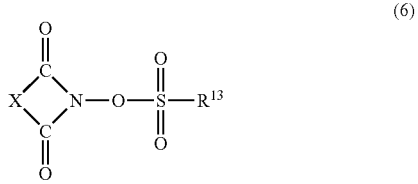

(6)

wherein, in the formula (6), X represents a divalent group such as an alkylene, arylene, or alkoxylene group, and $R^{13}$ represents a monovalent group such as an alkyl, aryl, halogen-substituted alkyl, or halogen-substituted aryl group.

5. The radiation-sensitive resin composition according to claim 1, characterized in that the compound having a structure represented by the formula (1-a) and a structure represented by the formula (1-b), in the component (A) is 2,4,6-trimethylphenyldiphenylsulfonium 2,4-difluorobenzenesulfonate or 2,4,6-trimethylphenyldiphenylsulfonium 4-trifluoromethylbenzenesulfonate.

\* \* \* \* \*